US008828879B2

(12) United States Patent
Kanno et al.

(10) Patent No.: US 8,828,879 B2
(45) Date of Patent: Sep. 9, 2014

(54) SILICON-CONTAINING COMPOSITION HAVING SULFONAMIDE GROUP FOR FORMING RESIST UNDERLAYER FILM

(75) Inventors: Yuta Kanno, Toyama (JP); Makoto Nakajima, Toyama (JP); Wataru Shibayama, Toyama (JP)

(73) Assignee: Nissan Chemical Industries, Ltd., Tokyo (JP)

(*) Notice: Subject to any disclaimer, the term of this patent is extended or adjusted under 35 U.S.C. 154(b) by 137 days.

(21) Appl. No.: 13/496,768

(22) PCT Filed: Sep. 7, 2010

(86) PCT No.: PCT/JP2010/065307
§ 371 (c)(1),
(2), (4) Date: Mar. 16, 2012

(87) PCT Pub. No.: WO2011/033965
PCT Pub. Date: Mar. 24, 2011

(65) Prior Publication Data
US 2012/0178261 A1    Jul. 12, 2012

(30) Foreign Application Priority Data
Sep. 16, 2009  (JP) ................. 2009-214488

(51) Int. Cl.
C08G 77/04    (2006.01)
C09D 183/08   (2006.01)
C08G 77/28    (2006.01)

(52) U.S. Cl.
USPC ..... 438/703; 430/449; 556/422; 257/E21.249

(58) Field of Classification Search
CPC .............. H01L 21/0271; H01L 21/0273
See application file for complete search history.

(56) References Cited

U.S. PATENT DOCUMENTS

| | | | |
|---|---|---|---|
| 3,813,364 A | 5/1974 | De Zuba et al. | |
| 5,100,503 A | 3/1992 | Allman et al. | |
| 5,152,834 A | 10/1992 | Allman | |
| 5,209,775 A | 5/1993 | Bank et al. | |
| 5,302,198 A | 4/1994 | Allman | |
| 5,472,488 A | 12/1995 | Allman | |
| 5,527,872 A | 6/1996 | Allman | |
| 5,665,845 A | 9/1997 | Allman | |
| 5,962,188 A | 10/1999 | DeBoer et al. | |
| 6,576,393 B1 | 6/2003 | Sugita et al. | |
| 7,192,683 B2 | 3/2007 | Yamasaki et al. | |
| 2004/0253461 A1* | 12/2004 | Ogihara et al. | 428/447 |
| 2004/0266925 A1 | 12/2004 | Shiono | |
| 2006/0003252 A1 | 1/2006 | Hirayama et al. | |
| 2006/0093959 A1 | 5/2006 | Huang et al. | |
| 2007/0190459 A1 | 8/2007 | Hashimoto et al. | |
| 2007/0224816 A1 | 9/2007 | Uh et al. | |
| 2008/0076059 A1 | 3/2008 | Abdallah et al. | |
| 2008/0107997 A1 | 5/2008 | Hiroi et al. | |
| 2008/0312400 A1 | 12/2008 | Yamashita et al. | |
| 2009/0050020 A1 | 2/2009 | Konno et al. | |
| 2009/0130594 A1* | 5/2009 | Takei et al. | 430/271.1 |
| 2009/0148789 A1 | 6/2009 | Amara et al. | |
| 2009/0162782 A1 | 6/2009 | Takei et al. | |
| 2010/0151384 A1 | 6/2010 | Konno et al. | |
| 2010/0304305 A1 | 12/2010 | Nakajima et al. | |
| 2010/0330505 A1 | 12/2010 | Nakajima et al. | |
| 2011/0143149 A1 | 6/2011 | Shibayama et al. | |
| 2011/0287369 A1 | 11/2011 | Shibayama et al. | |
| 2012/0070994 A1 | 3/2012 | Kanno et al. | |
| 2012/0315765 A1 | 12/2012 | Nakajima et al. | |
| 2013/0078814 A1 | 3/2013 | Shibayama et al. | |

FOREIGN PATENT DOCUMENTS

| | | |
|---|---|---|
| EP | 0 260 976 A2 | 3/1988 |
| EP | 1 798 599 A1 | 6/2007 |
| EP | 1 855 159 A1 | 11/2007 |
| EP | 2 249 204 A1 | 11/2010 |
| JP | A-54-123965 | 9/1979 |
| JP | A-05-027444 | 2/1993 |
| JP | A-05-311158 | 11/1993 |
| JP | A-05-333292 | 12/1993 |
| JP | A-06-001796 | 1/1994 |
| JP | A-06-228459 | 8/1994 |
| JP | A-08-053560 | 2/1996 |
| JP | A-10-209134 | 8/1998 |
| JP | A-10-510860 | 10/1998 |
| JP | A-11-012544 | 1/1999 |
| JP | A-11-258813 | 9/1999 |

(Continued)

OTHER PUBLICATIONS

Oct. 19, 2010 International Search Report issued in International Patent Application No. PCT/JP2010/065307.
Mar. 10, 2009 International Search Report issued in Application No. PCT/JP2009/052535.
Nov. 2, 2009 International Search Report issued in International Application No. PCT/JP2009/064301.
Feb. 1, 2013 Office Action issued in U.S. Appl. No. 13/681,186.
Mar. 9, 2010 International Search Report issued in International Patent Application No. PCT/JP2009/070984.
May 8, 2012 Search Report issued in European Patent Application No. 09833458.4.

(Continued)

Primary Examiner — Charles Garber
Assistant Examiner — Alia Sabur
(74) Attorney, Agent, or Firm — Oliff PLC

(57) ABSTRACT

There is provided a lithographic resist underlayer film-forming composition for forming a resist underlayer film which can be used as a hard mask. A lithographic resist underlayer film-forming composition including a silane compound having sulfonamide group, wherein the silane compound having sulfonamide group is a hydrolyzable organosilane having a sulfonamide group in the molecule, a hydrolyzate thereof, or a hydrolytic condensation product thereof. The composition including a silane compound having sulfonamide group and a silane compound lacking a sulfonamide group, wherein the silane compound having sulfonamide group is present within the silane compounds overall in a proportion of less than 1 mol %, for example 0.1 to 0.95 mol %.

12 Claims, No Drawings

(56) References Cited

FOREIGN PATENT DOCUMENTS

| | | |
|---|---|---|
| JP | A-2000-282014 | 10/2000 |
| JP | A-2001-093824 | 4/2001 |
| JP | A-2001-294810 | 10/2001 |
| JP | A-2004-276603 | 10/2004 |
| JP | A-2005-070776 | 3/2005 |
| JP | A-2005-255858 | 9/2005 |
| JP | A-2006-182688 | 7/2006 |
| JP | A-2007-31627 | 2/2007 |
| JP | A-2007-081133 | 3/2007 |
| JP | A-2007-241259 | 9/2007 |
| JP | A-2007-258622 | 10/2007 |
| JP | A-2008-519297 | 6/2008 |
| JP | A-2008-213177 | 9/2008 |
| JP | 2009244722 A * | 10/2009 |
| JP | A-2009-244722 | 10/2009 |
| WO | WO 96/018918 | 6/1996 |
| WO | WO 2004/055598 A1 | 7/2004 |
| WO | WO 2006/093057 A1 | 9/2006 |
| WO | WO 2007/066597 A1 | 6/2007 |
| WO | WO 2008/038863 A1 | 4/2008 |
| WO | WO 2009/034998 A1 | 3/2009 |
| WO | WO 2009/041511 A1 | 4/2009 |
| WO | WO 2009/104552 A1 | 8/2009 |
| WO | WO 2009/111121 A2 | 9/2009 |
| WO | WO 2009/111122 A2 | 9/2009 |

OTHER PUBLICATIONS

Feb. 7, 2013 Office Action issued in U.S. Appl. No. 13/133,751.
U.S. Appl. No. 13/133,751, filed Aug. 4, 2011.
Jun. 22, 2010 Written Opinion of ISA issued in International Patent Application No. PCT/JP2010/059117 (translation).
Jun. 22, 2010 International Search Report issued in International Patent Application No. PCT/JP2010/059117.
May 24, 2011 Translation of the Written Opinion issued in PCT/JP2011/053525.
May 24, 2011 Translation of the International Search Report issued in PCT/JP2011/053525.
Jun. 7, 2012 Office Action issued in U.S. Appl. No. 12/867,587.
Mar. 21, 2013 Final Rejection issued in U.S. Appl. No. 12/867,587.
Oct. 18, 2012 Restriction Requirement issued in U.S. Appl. No. 13/133,751.
Dec. 9, 2011 European Search Report issued in Application No. 09712238.6.
U.S. Appl. No. 12/867,587, filed Aug. 13, 2010.
U.S. Appl. No. 13/681,186, filed Nov. 19, 2012.
U.S. Appl. No. 13/375,517, filed Dec. 1, 2011.
U.S. Appl. No. 13/580,066, filed Aug. 20, 2012.
U.S. Appl. No. 13/058,109, filed Feb. 8, 2011.
U.S. Office Action dated Oct. 4, 2013 from U.S. Appl. No. 13/058,109.
U.S. Office Action dated Oct. 21, 2013 from U.S. Appl. No. 13/681,186.
U.S. Office Action dated Nov. 29, 2013 from U.S. Appl. No. 13/375,517.
U.S. Office Action dated Dec. 3, 2013 from U.S. Appl. No. 13/580,066.
Notice of Examination Opinion and Search Report dated Feb. 6, 2014 from Taiwanese Patent Application No. 098143678 (with English-language translation).
Office Action cited in U.S. Appl. No. 13/133,751 on Dec. 26, 2013.
U.S. Office Action dated May 1, 2014 from U.S. Appl. No. 13/580,066.

* cited by examiner

SILICON-CONTAINING COMPOSITION HAVING SULFONAMIDE GROUP FOR FORMING RESIST UNDERLAYER FILM

TECHNICAL FIELD

The present invention relates to a composition for forming an underlayer film between a substrate and a resist (such as a photoresist or an electron beam resist) used in the fabrication of a semiconductor device. More specifically, the present invention relates to a lithographic resist underlayer film-forming composition for forming an underlayer film to be used as the photoresist underlayer in the lithographic step in semiconductor device fabrication. The present invention further relates to a resist patterning method which uses such an underlayer film-forming composition.

BACKGROUND ART

Microfabrication by lithography using a photoresist has hitherto been carried out in the manufacture of semiconductor devices. Such microfabrication is a process that entails forming a thin film of photoresist on a semiconductor substrate such as a silicon wafer, exposing the photoresist from above to actinic light such as ultraviolet light through a mask on which the pattern for a semiconductor device has been written, developing the exposed photoresist so as to form a photoresist pattern, and etching the substrate while using the photoresist pattern as a protective layer so as to form on the substrate surface very small features which correspond to the pattern. In recent years, with the advances being made toward higher levels of integration in semiconductor devices, there has been a trend toward the use of shorter wavelength actinic light, specifically from a KrF excimer laser (248 nm) to an ArF excimer laser (193 nm). Along with this, the influence of actinic light reflected from the semiconductor substrate has become a major problem. To resolve this problem, methods for providing an anti-reflective coating (bottom anti-reflective coating) between the photoresist and the substrate are being widely investigated. Owing to their ease of use, numerous investigations are being carried out on organic anti-reflective coatings composed of, e.g., polymers having light-absorbing groups, as such anti-reflective coatings. Examples include acrylic resin-based anti-reflective coatings having a hydroxyl group (a crosslinking reaction group) and a light-absorbing group on the same molecule, and novolak resin-based anti-reflective coatings having a hydroxyl group (crosslinking reaction group) and a light-absorbing group on the same molecule.

The properties required of anti-reflective coatings include a large absorbance with respect to light and radiation, the absence of intermixing with photoresist (insolubility in a photoresist solution), no diffusion of low-molecular-weight substances from the anti-reflective coating to the overlying photoresist layer during heating and baking, and a high dry etch rate compared with the photoresist.

Recently, in order to resolve the growing problem of wire delay associated with advances toward a finer pattern rule in semiconductor devices, investigations involving the use of copper as the interconnect material have been carried out. Together with this, the dual damascene process is being investigated as a method of forming interconnects on a semiconductor substrate. In the dual damascene process, an anti-reflective coating is formed on a substrate in which via holes have been formed and which has a large aspect ratio. Hence, the anti-reflective coating used in this process is required to have, for example, burial properties that enable the holes to be filled without leaving any gaps, and planarizing properties such that a flat film is formed on the substrate surface.

A film known as a hard mask which includes silicon and metallic elements such as titanium is used as the underlayer film between a semiconductor substrate and a photoresist (see, for example, Patent Document 1). Because of major differences between the constituent ingredients in the resist and the hard mask, their rates of removal by dry etching are strongly dependent on the gas species used in dry etching. Through suitable selection of the gas species, it is possible to remove the hard mask by dry etching without a large accompanying decrease in the photoresist film thickness. Hence, in semiconductor device fabrication today, to achieve various effects, including an anti-reflection effect, it has become common practice to place a resist underlayer film between the semiconductor substrate and the photoresist. Although investigations have hitherto been carried out on resist underlayer film compositions, owing in part to the multiplicity of the properties required, there exists a need for the development of novel resist underlayer film materials.

Compositions and patterning methods which use compounds having silicon-silicon bonds are known (see, for example, Patent Document 2).

Silicon-containing resist overcoat film-forming compositions which contain sulfonamide groups have been disclosed (see, for example, Patent Document 3).

In addition, silicon-containing resist underlayer film-forming compositions which contain sulfonamide groups have been disclosed (see, for example, Patent Document 4).

Patent Document 1: Japanese Patent Application Publication No. H11-258813
Patent Document 2: Japanese Patent Application Publication No. H10-209134
Patent Document 3: Japanese Translation of PCT Application No. 2008-519297
Patent Document 4: Japanese Patent Application Publication No. 2009-244722

SUMMARY OF THE INVENTION

Problem to be Solved by the Invention

It is therefore an object of the present invention to provide a lithographic resist underlayer film-forming composition which can be used in the fabrication of semiconductor devices. More specifically, one object of the present invention is to provide a lithographic resist underlayer film-forming composition for forming a resist underlayer film which can be used as a hard mask. Another object is to provide a lithographic resist underlayer film-forming composition for forming a resist underlayer film which can be used as an anti-reflective coating. Yet another object is to provide a lithographic resist underlayer film which does not give rise to intermixing with the resist and has a higher dry etch rate than the resist, and a lithographic resist underlayer film-forming composition for forming such an underlayer film.

A further object of the present invention is to provide a method of fabricating semiconductor devices using such a lithographic resist underlayer film-forming composition.

Means for Solving the Problem

Accordingly, the present invention provides:
in a first aspect, a lithographic resist underlayer film-forming composition which includes a silane compound having sulfonamide group, wherein the silane compound having sulfonamide group is a hydrolyzable organosilane having a sulfonamide group in the molecule, a hydrolyzate thereof, or a hydrolytic condensation product thereof;

in a second aspect, the composition according to the first aspect which includes a silane compound having sulfonamide group and a silane compound lacking a sulfonamide group, wherein the silane compound having sulfonamide group is present within the silane compounds overall in a proportion of less than 1 mol %;

in a third aspect, the composition according to the first or second aspect which includes a silane compound having sulfonamide group and a silane compound lacking a sulfonamide group, wherein the silane compound having sulfonamide group is present within the silane compounds overall in a proportion of from 0.1 to 095 mol %;

in a fourth aspect, the composition according to any one of the first to third aspects, wherein the hydrolyzable organosilane is a compound of formula (1)

  Formula (1)

(where $R^1$ is a sulfonamide group or an organic group containing the same and is a group bonded to a silicon atom by a Si—N bond, a Si—S bond or a Si—C bond; $R^2$ is an alkyl group, an aryl group, a halogenated alkyl group, a halogenated aryl group or an alkenyl group, or an organic group having an epoxy group, an acryloyl group, a methacryloyl group, a mercapto group or a cyano group, and is a group bonded to a silicon atom by a Si—C bond; $R^3$ is an alkoxy group, an acyloxy group or a halogen atom; "a" is the integer 1 or 2; "b" is the integer 0 or 1; and "a+b" is the integer 1 or 2);

in a fifth aspect, the composition according to the fourth aspect, wherein the sulfonamide group corresponding to or included within $R^1$ in formula (1) is a group of formula (2)

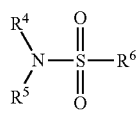  Formula (2)

(where at least one group from among $R^4$, $R^5$ and $R^6$ in formula (2) is bonded to a silicon atom directly or through a linkage group, and each remaining group is a hydrogen atom, an alkyl group, an aryl group, a halogenated alkyl group, a halogenated aryl group or an alkenyl group, or a group having an epoxy group, an acryloyl group, a methacryloyl group, a mercapto group or a cyano group);

in a sixth aspect, the composition according to any one of the first to fifth aspects which includes at least one compound selected from the group consisting of a hydrolyzable organosilane of formula (1) and an organosilicon compound of formula (3)

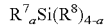  Formula (3)

(where $R^7$ is an alkyl group, an aryl group, a halogenated alkyl group, a halogenated aryl group or an alkenyl group, or an organic group having an epoxy group, an acryloyl group, a methacryloyl group, a mercapto group or a cyano group, and is a group bonded to a silicon atom by a Si—C bond; $R^8$ is an alkoxy group, an acyloxy group or a halogen atom; and "a" is an integer from 0 to 3), a hydrolyzable organosilane of formula (1) and an organosilicon compound of formula (4)

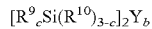  Formula (4)

(where $R^9$ is an alkyl group and is a group bonded to a silicon atom by a Si—C bond; $R^{10}$ is an alkoxy group, an acyloxy group or a halogen atom; Y is an alkylene group or an arylene group; "b" is the integer 0 or 1; and "c" is the integer 0 or 1), and a hydrolyzable organosilane of formula (1), an organosilicon compound of formula (3) and an organosilicon compound of formula (4), or a hydrolyzate thereof, a hydrolytic condensation product thereof, or a mixture thereof;

in a seventh aspect, the composition according to any one of the first to sixth aspects which includes, as a polymer, a compound of formula (1) or a hydrolytic condensation product of a compound of formula (1), and a hydrolytic condensation product of a compound of formula (3);

in an eighth aspect, the composition according to any one of the first to seventh aspects which further includes an acid as a hydrolysis catalyst;

in a ninth aspect, the composition according to any one of the first to eighth aspects which further includes water;

in a tenth aspect, a resist underlayer film obtained by coating the resist underlayer film-forming composition of any one of the first to ninth aspects onto a semiconductor substrate, and baking the applied composition;

in an eleventh aspect, a method for fabricating semiconductor devices, which includes the steps of: coating the resist underlayer film-forming composition of any one of the first to ninth aspects onto a semiconductor substrate and baking the applied composition so as to form a resist underlayer film; coating a resist composition onto the underlayer film so as to form a resist layer; exposing the resist layer to light; developing the exposed resist so as to obtain a resist pattern; etching the resist underlayer film through the resist pattern; and processing the semiconductor substrate through the patterned resist and resist underlayer film; and in a twelfth aspect, a method for fabricating semiconductor devices, which includes the steps of: forming an organic underlayer film on a semiconductor substrate; coating thereon the resist underlayer film-forming composition of any one of the first to ninth aspects and baking the applied composition so as to form a resist underlayer film; coating a resist composition onto the resist underlayer film so as to form a resist layer; exposing the resist layer to light; developing the exposed resist so as to obtain a resist pattern; etching the resist underlayer film through the resist pattern; etching the organic underlayer film through the patterned resist underlayer film; and processing the semiconductor substrate through the patterned organic underlayer film.

Effects of the Invention

In the present invention, either a resist underlayer film is formed on a substrate by a coating method or a resist underlayer film is formed on a substrate and over an intervening organic underlayer film by a coating method, and a resist film (e.g., photoresist, electron beam resist) is formed on the resist underlayer film. Next, a resist pattern is formed by exposure and development, then pattern transfer is carried out by dry etching the resist underlayer film through the resist pattern, following which either the substrate is etched through this pattern or the pattern is transferred by etching an organic underlayer film and etching of the substrate is carried out through the organic underlayer film.

In forming a fine pattern, the tendency has been to make the resist film thickness smaller so as to prevent pattern collapse. Because the resist film is thinner, when dry etching is carried out to transfer the pattern to an underlying film, pattern transfer cannot be achieved unless the underlying film has a higher etch rate than the overlying film. In the present invention, the (inorganic silicon compound-containing) resist underlayer film disclosed herein covers a substrate, either over an intervening organic underlayer film, or without an intervening organic underlayer film, and is covered in turn by a resist film (organic resist film). The films of organic components and the film of inorganic components have widely differing dry etch rates depending on selection of the etching gas; the films of organic components have high dry etch rates in oxygen-based gases, and the film of inorganic components has a high dry etch rate in halogen-containing gases.

For example, a resist pattern is formed, the resist underlayer film according to the present invention which is the layer underlying the resist pattern is dry etched with a halogen-containing gas, thereby transferring the pattern to the resist underlayer film and, using the pattern that was transferred to the resist underlayer film, etching of the substrate is carried out with a halogen-containing gas. Alternatively, using the resist underlayer film to which the pattern has been transferred, pattern transfer to an organic underlayer film lying below the resist underlayer film is carried out by dry etching the organic underlayer film with an oxygen-based gas, following which the organic underlayer film to which the pattern has been transferred is used to process the substrate with a halogen-containing gas.

In the present invention, the resist underlayer film functions as a hard mask, with hydrolyzable groups such as alkoxy groups, acyloxy groups and halogen atoms in the structure in formula (1) hydrolyzing or partially hydrolyzing, and a polymer having a polysiloxane structure subsequently forming due to silanol group condensation reactions. This polyorganosiloxane structure functions adequately as a hard mask.

The sulfonamide group-bearing hydrolyzable organosilane compound of formula (1) used in the present invention forms a polyorganosiloxane by hydrolysis and a subsequent condensation reaction.

Introducing a sulfonamide group improves adhesion with the resist coated thereon, resulting in a good resist shape.

These bonding sites included in the polyorganosiloxane have carbon-nitrogen bonds or nitrogen-sulfur bonds, for which the dry etch rate by a halogen-containing gas is higher than for carbon-carbon bonds, and are thus effective when transferring the overlying resist pattern to this resist underlayer film.

In addition, the polyorganosiloxane structure (intermediate film) is effective as a hard mask for etching an organic underlayer film therebelow and etching the substrate. That is, it has an adequate dry etching resistance during substrate etching and to the oxygen-based dry etching gas used for etching the organic underlayer film.

The resist underlayer film of the present invention increases the dry etch rate on such overlying resists and has a resistance to dry etching during substrate etching and the like.

Hence, from the above, a lithographic resist underlayer film which can be utilized as both a hard mask and an antireflective coating, does not give rise to intermixing with resist, and has a high dry etch rate compared with resist can be formed from the resist underlayer film-forming composition of the present invention.

Moreover, the method for fabricating semiconductor devices according to the present invention is capable of forming a fine pattern on a semiconductor substrate such as a silicon wafer.

MODES FOR CARRYING OUT THE INVENTION

The present invention provides a film-forming composition which is a film-forming composition containing a silane compound having sulfonamide group, the silane compound having sulfonamide group being a hydrolyzable organosilane having a sulfonamide group in the molecule, a hydrolyzate thereof, or a hydrolytic condensation product thereof. Moreover, the present invention provides a lithographic resist underlayer film-forming composition which is a resist underlayer film-forming composition containing a silane compound having sulfonamide group, the silane compound having sulfonamide group being a hydrolyzable organosilane having a sulfonamide group in the molecule, a hydrolyzate thereof, or a hydrolytic condensation product thereof.

In the present invention, the composition may be one which includes a silane compound having sulfonamide group and a silane compound lacking a sulfonamide group, wherein the silane compound having sulfonamide group is present within the silane compounds overall in a proportion of less than 1 mol %.

In addition, the composition may be one which includes a silane compound having sulfonamide group and a silane compound lacking a sulfonamide group, wherein the silane compound having sulfonamide group is present within the silane compounds overall in a proportion of from 0.1 to 0.95 mol %.

Moreover, the above-described hydrolyzable silane, a hydrolyzate thereof and a hydrolytic condensation product thereof may be used as a mixture thereof. Use is possible as the condensation product obtained by hydrolyzing the hydrolyzable silane, then condensing the resulting hydrolyzate. Use may also be made of a partial hydrolyzate wherein, when obtaining the hydrolytic condensation product, hydrolysis is not completely finished, or of a mixture obtained by mixing a silane compound with the hydrolytic condensation product. This condensation product is a polymer having a polysiloxane structure. Sulfonamide groups or organic groups containing the same are bonded to this polysiloxane. It is also possible to add a sulfonamide group-bearing hydrolyzable silane compound to a hydrolytic condensation product lacking sulfonamide.

The resist underlayer film-forming composition of the present invention includes a hydrolyzable organosilane having a sulfonamide group in the molecule, a hydrolyzate thereof, or a hydrolytic condensation product thereof, and a solvent. The composition may also include such optional ingredients as acids, water, alcohols, curing catalysts, acid generators, other organic polymers, light-absorbing compounds and surfactants.

The solids content of the resist underlayer film-forming composition of the present invention is, for example, from 0.5 to 50 mass %, from 1 to 30 mass %, or from 1 to 25 mass %. Here, "solids content" refers to what remains when the solvent components have been removed from the total components of the (resist underlayer) film-forming composition.

The hydrolyzable organosilane, hydrolyzate thereof and hydrolytic condensation product thereof accounts for a proportion of the solids content which is at least 20 mass %, such as from 50 to 100 mass %, from 60 to 100 mass %, or from 70 to 100 mass %.

The hydrolyzable organosilane used in the present invention has the structure in formula (1).

In the formula, $R^1$ is a sulfonamide group or an organic group containing the same and is bonded to a silicon atom by a Si—N bond, a Si—S bond or a Si—C bond.

$R^2$ is an alkyl group, an aryl group, a halogenated alkyl group, a halogenated aryl group or an alkenyl group, or an organic group having an epoxy group, an acryloyl group, a methacryloyl group, a mercapto group or a cyano group, and is bonded to a silicon atom by a Si—C bond. $R^3$ is an alkoxy group, an acyloxy group or a halogen atom. In addition, "a" is the integer 1 or 2, "b" is the integer 0 or 1, and "a+b" is the integer 1 or 2.

In $R^2$ of formula (1), the alkyl group is a linear or branched $C_{1-10}$ alkyl group, illustrative examples of which include a methyl group, an ethyl group, an n-propyl group, an i-propyl group, an n-butyl group, an i-butyl group, an s-butyl group, a t-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group and a 1-ethyl-2-methyl-n-propyl group.

Alternatively, a cyclic alkyl group may be used, such as a $C_{1-10}$ cyclic alkyl group, illustrative examples of which include a cyclopropyl group, a cyclobutyl group, a 1-methylcyclopropyl group, a 2-methylcyclopropyl group, a cyclopentyl group, a 1-methylcyclobutyl group, a 2-methylcyclobutyl group, a 3-methylcyclobutyl group, a 1,2-dimethylcyclopropyl group, a 2,3-dimethylcyclopropyl group, a 1-ethylcyclopropyl group, a 2-ethylcyclopropyl group, a cyclohexyl group, a 1-methylcyclopentyl group, a 2-methylcyclopentyl group, a 3-methylcyclopentyl group, a 1-ethylcyclobutyl group, a 2-ethylcyclobutyl group, a 3-ethylcyclobutyl group, a 1,2-dimethylcyclobutyl group, a 1,3-dimethylcyclobutyl group, a 2,2-dimethylcyclobutyl group, a 2,3-dimethylcyclobutyl group, a 2,4-dimethylcyclobutyl group, a 3,3-dimethylcyclobutyl group, a 1,n-propylcyclopropyl group, a 2-n-propylcyclopropyl group, a 1-i-propylcyclopropyl group, a 2-i-propylcyclopropyl group, a 1,2,2-trimethylcyclopropyl group, a 1,2,3-trimethylcyclopropyl group, a 2,2,3-trimethylcyclopropyl group, a 1-ethyl-2-methylcyclopropyl group, a 2-ethyl-1-methylcyclopropyl group, a 2-ethyl-2-methylcyclopropyl group and a 2-ethyl-3-methylcyclopropyl group.

The aryl group may be a $C_{6-20}$ aryl group, illustrative examples of which include a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-mercaptophenyl group, an o-methoxyphenyl group, a p-methoxyphenyl group, a p-aminophenyl group, a p-cyanophenyl group, an α-naphthyl group, β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group and a 9-phenanthryl group.

The alkenyl group may be a $C_{2-10}$ alkenyl group, illustrative examples of which include a 1-ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pententyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylenecyclopentyl group, a 3-methyl-1-cyclopentenyl, a 3-methyl-2-cyclopentenyl group, a 3-methyl-3-cyclopentenyl group, a 3-methyl-4-cyclopentenyl group, a 3-methyl-5-cyclopentenyl group, a 3-methylenecyclopentyl group, a 1-cyclohexenyl group, a 2-cyclohexenyl group and a 3-cyclohexenyl group.

Further examples include the above organic groups substituted with halogen atoms such as fluorine, chlorine, bromine or iodine.

Examples of organic groups having an epoxy group include a glycidoxymethyl group, a glycidoxyethyl group, a glycidoxypropyl group, a glycidoxybutyl group and a epoxycyclohexyl group.

Examples of organic groups having an acryloyl group include an acryloylmethyl group, an acryloylethyl group and an acryloylpropyl group.

Examples of organic groups having a methacryloyl group include a methacryloylmethyl group, a methacryloylethyl group and a methacryloylpropyl group.

Examples of organic groups having a mercapto group include an ethylmercapto group, a butylmercapto group, a hexylmercapto group and an octylmercapto group.

Examples of organic groups having a cyano group include a cyanoethyl group and a cyanopropyl group.

In $R^3$ of formula (1), $C_{1-20}$ alkoxy groups are exemplified by alkoxy groups having $C_{1-20}$ linear, branched or cyclic alkyl moieties. Illustrative examples include a methoxy group, an ethoxy group, an n-propoxy group, an i-propoxy group, an n-butoxy group, an i-butoxy group, an s-butoxy group, a t-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n- propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-propoxy group and a 1-ethyl-2-methyl-n-propoxy group. Illustrative examples of cyclic alkoxy groups include a cyclopropoxy group, a cyclobutoxy group, a 1-methylcyclopropoxy group, a 2-methylcyclopropoxy group, a cyclopentyloxy group, a 1-methylcyclobutoxy group, a 2-methylcyclobutoxy group, a 3-methylcyclobutoxy group, a 1,2-dimethylcyclopropoxy group, a 2,3-dimethylcyclopropoxy group, a 1-ethyl-cyclopropoxy group, a 2-ethylcyclopropoxy group, a cyclohexyloxy group, a 1-methylcyclopentyloxy group, a 2-methylcyclopentyloxy group, a 3-methylcyclopentyloxy group, a 1-ethylcyclobutoxy group, a 2-ethylcyclobutoxy group, a 3-ethylcyclobutoxy group, a 1,2-dimethylcyclobutoxy group, a 1,3-dimethylcyclobutoxy group, a 2,2-dimethylcyclobutoxy group, a 2,3-dimethylcyclobutoxy group, a 2,4-dimethylcyclobutoxy group, a 3,3-dimethylcyclobutoxy group, a 1-n-propylcyclopropoxy group, a 2-n-propylcyclopropoxy group, a 1-i-propylcyclopropoxy group, a 2-i-propylcyclopropoxy group, a 1,2,2-trimethylcyclopropoxy group, a 1,2,3-trimethylcyclopropoxy group, a 2,2,3-trimethylcyclopropoxy group, a 1-ethyl-2-methylcyclopropoxy group, a 2-ethyl-1-methylcyclopropoxy group, a 2-ethyl-2-methylcyclopropoxy group and a 2-ethyl-3-methylcyclopropoxy group.

In $R^3$ of formula (1), examples of $C_{1-20}$ acyloxy groups include a methylcarbonyloxy group, an ethylcarbonyloxy group, an n-propylcarbonyloxy group, an i-propylcarbonyloxy group, an n-butylcarbonyloxy group, an i-butylcarbonyloxy group, an s-butylcarbonyloxy group, a t-butylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy, a 3,3-dimethyl-n-butylcarbonyloxy group, a 1-ethyl-n-butylcarbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a phenylcarbonyloxy group and a tosylcarbonyloxy group.

Examples of halogen atoms on $R^3$ in formula (1) include fluorine, chlorine, bromine and iodine.

$R^1$ in formula (1) is a sulfonamide group or an organic group including the same. The structure in formula (2) may be used as the sulfonamide group. At least one group from among $R^4$, $R^5$ and $R^6$ in formula (2) is bonded to a silicon atom directly or through a linkage group, and each remaining group is a hydrogen atom, an alkyl group, an aryl group, a halogenated alkyl group, a halogenated aryl group or an alkenyl group, or a group having an epoxy group, an acryloyl group, a methacryloyl group, a mercapto group or a cyano group. These organic groups may be exemplified by the above-described organic groups.

A commercial product may be used as the hydrolyzable organosilane of formula (1).

Hydrolyzable organosilanes having a sulfonamide group may be obtained by, for example, reacting an amine with a sulfonyl halide, or by reacting a cyclic ether with a sulfonamide compound.

It is essential for a hydrolyzable silane to be included in at least one of the amine and the sulfonyl halide. Illustrative examples include methods of reacting an amino group-containing hydrolyzable silane with a sulfonyl halide, methods of reacting an amine with a sulfonyl halide-containing hydrolyzable silane, and methods of reacting an amino group-containing hydrolyzable silane with a sulfonyl halide-containing hydrolyzable silane. Halogen atoms which may be used as the halide include fluorine, chlorine, bromine and iodine. Preferred use may be made of chlorine.

The synthesis conditions for reacting an amine with a sulfonyl halide may involve the use of a solvent such as dichloromethane, a temperature of from −20 to 40° C., and a reaction time of from 0.5 to 24 hours. The catalyst used at the time of this reaction may be, for example, N,N-dimethyl-4-aminopyridine.

A hydrolyzable silane compound which includes a primary or secondary amine on the molecule may be used as the above amino group-containing hydrolyzable silane compound. Illustrative examples include the following.

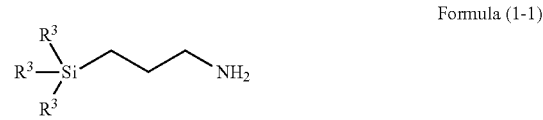

Formula (1-1)

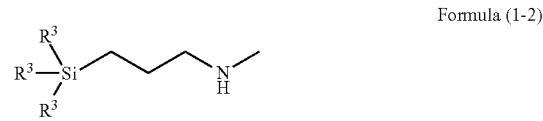

Formula (1-2)

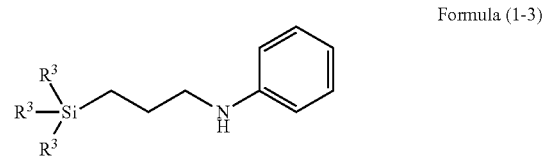

Formula (1-3)

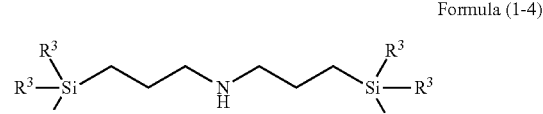

Formula (1-4)

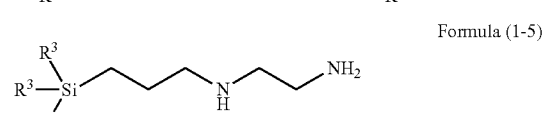

Formula (1-5)

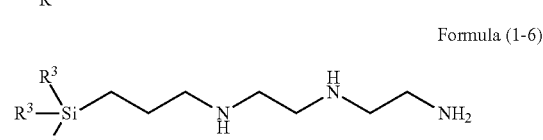

Formula (1-6)

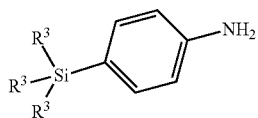
Formula (1-7)

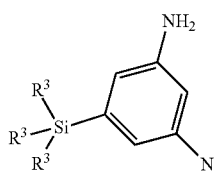
Formula (1-8)

Here, $R^3$ is an alkoxy group, an acyloxy group or a halogen atom, and is exemplified as described above.

Illustrative examples of the above sulfonyl halide-containing hydrolyzable slime compound are shown below.

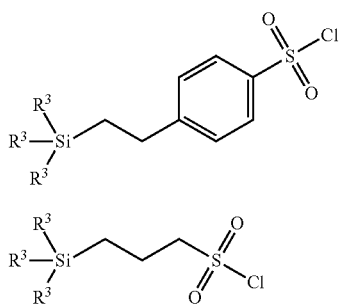
Formula (2-1)

Formula (2-2)

Here, $R^3$ is an alkoxy group, an acyloxy group or a halogen atom, and is exemplified as described above.

The sulfonyl halide which reacts with the above amino group-containing hydrolyzable silane compound is exemplified by the following.

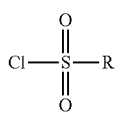
Formula (3-1)

Here, R is exemplified by the following organic groups.

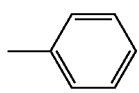
Formula (3-2)

Formula (3-3)

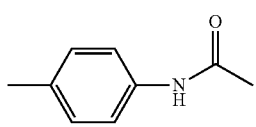
Formula (3-4)

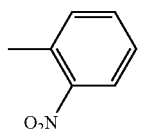
Formula (3-5)

—CH₃  Formula (3-6)

Formula (3-7)

—CF₃  Formula (3-8)

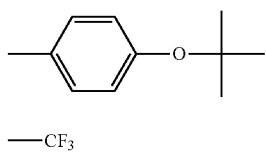
Formula (3-9)

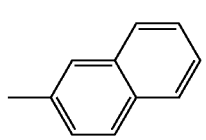
Formula (3-10)

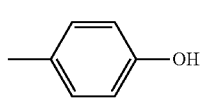
Formula (3-11)

A primary or secondary amine may be used as the amine which reacts with the above sulfonyl halide group-containing hydrolyzable silane compound. Illustrative examples of such amines include the following.

Formula (4-1)

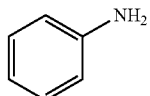
Formula (4-2)

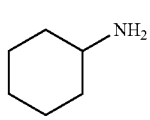
Formula (4-3)

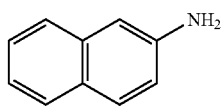
Formula (4-4)

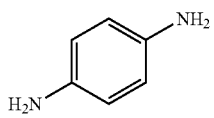
Formula (4-5)

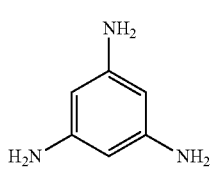
Formula (4-6)

-continued

Formula (4-7)
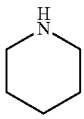

Formula (4-8)
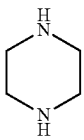

Formula (4-9)

Formula (4-10)
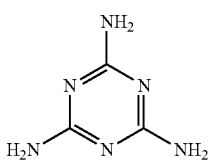

Formula (4-11)
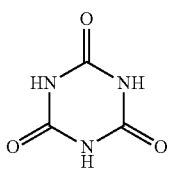

Formula (4-12)
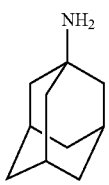

Formula (4-13)
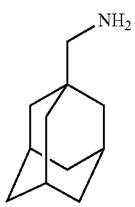

Formula (4-14)
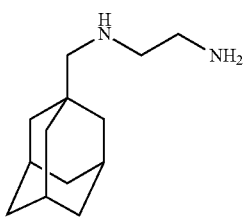

Formula (4-15)
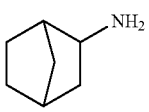

Formula (4-16)
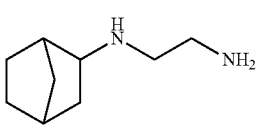

It is also possible to react the above amino group-containing hydrolyzable silane compound with the above sulfonyl halide group-containing hydrolyzable silane compound.

The compound of formula (1) obtained by reacting an amine with a sulfonyl halide is exemplified by the following.

Formula (5-1)
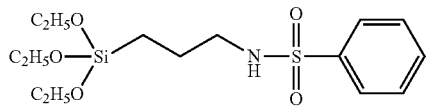

Formula (5-2)
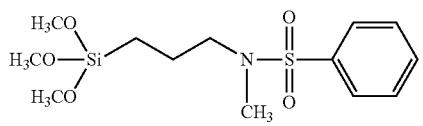

Formula (5-3)
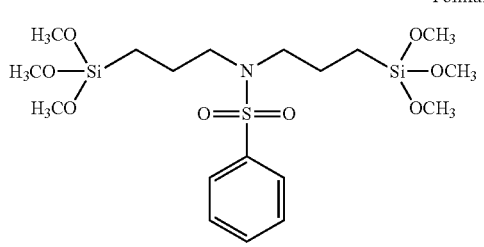

Formula (5-4)
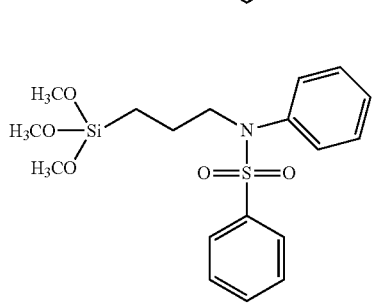

Formula (5-5)
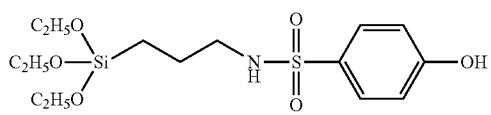

Formula (5-6)
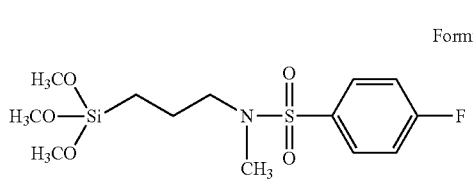

Formula (5-7)

Formula (5-8)
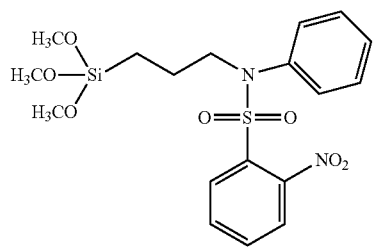
Formula (5-9)
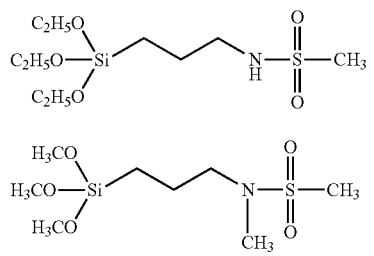
Formula (5-10)
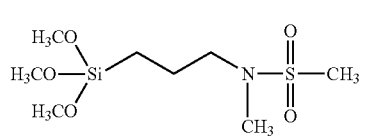
Formula (5-11)
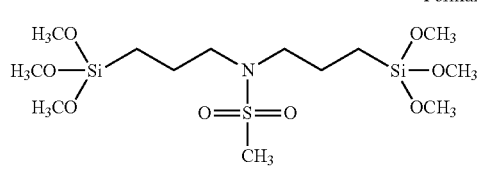
Formula (5-12)
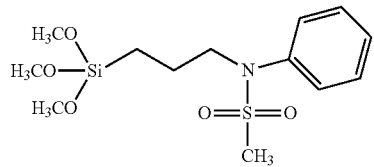
Formula (5-13)
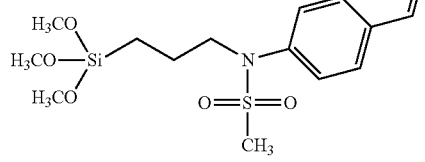
Formula (5-14)
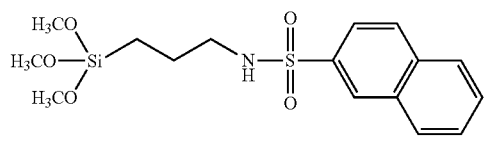
Formula (5-15)
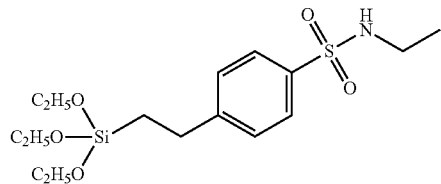
Formula (5-16)
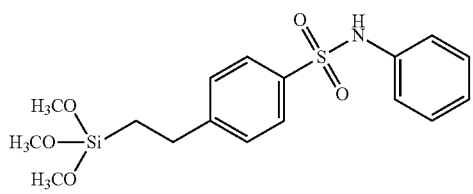
Formula (5-17)
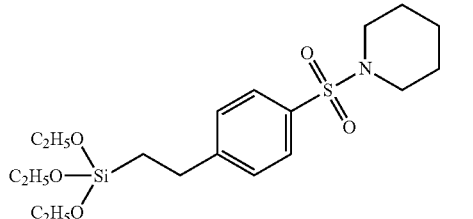
Formula (5-18)
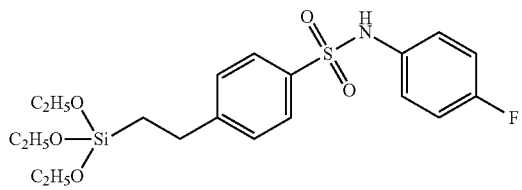
Formula (5-19)
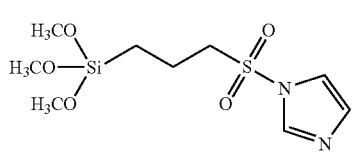
Formula (5-20)
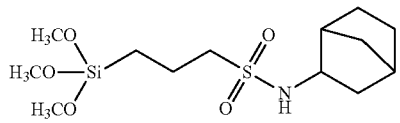
Formula (5-21)
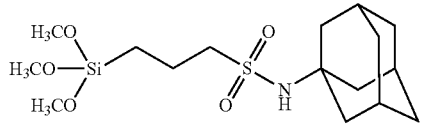
Formula (5-22)
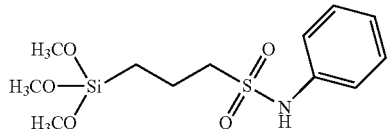
Formula (5-23)
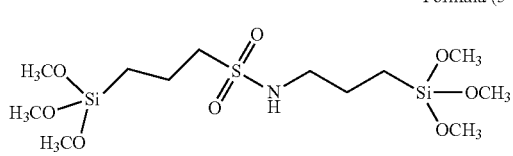

Formula (5-24)

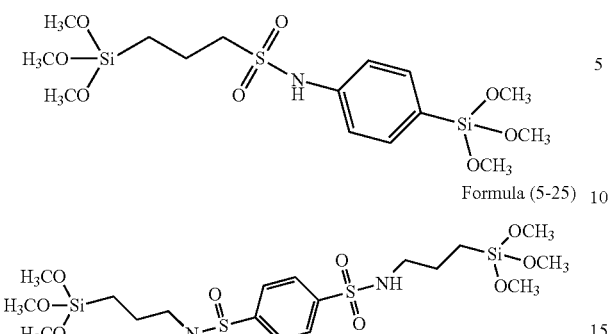

Formula (5-25)

Also, in the present invention, use may be made of a compound which includes a hydrolyzable silane in at least one of a cyclic ether and a sulfonamide. Examples include methods in which a cyclic ether group-containing hydrolyzable silane of formula (6-1) or (6-2) below is reacted with a sulfonamide, methods in which a sulfonamide group-containing hydrolyzable silane of above formula (5) is reacted with a cyclic ether of any one of formulas (8-1) to (8-7) below, and methods in which a cyclic ether group-containing hydrolyzable silane is reacted with a sulfonamide group-bearing hydrolyzable silane of above formula (5).

The synthesis conditions for reacting a cyclic amine with a sulfonamide may involve the use of a solvent such as methanol, a temperature of from −20 to 70° C., and a reaction time of from 0.5 to 48 hours. In addition, cesium carbonate or the like may be used as the catalyst at the time of this reaction.

The above cyclic ether group-containing hydrolyzable silane compound is exemplified by the following.

Formula (6-1)

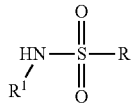

Formula (6-2)

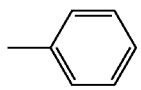

The sulfonamide compound which reacts with the above cyclic ether group-containing hydrolyzable silane compound is exemplified by the following.

Formula (7-1)

$$\text{HN}\overset{\text{R}^1}{\underset{}{\diagup}}\overset{\overset{\text{O}}{\|}}{\underset{\underset{\text{O}}{\|}}{\text{S}}}\text{—R}$$

Here, R is exemplified by the following organic groups.

Formula (7-2)

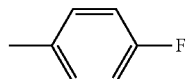

Formula (7-3)

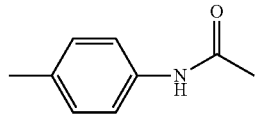

Formula (7-4)

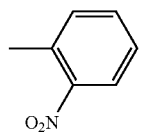

Formula (7-5)

—CH₃ Formula (7-6)

Formula (7-7)

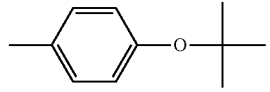

—CF₃ Formula (7-8)

Formula (7-9)

Formula (7-10)

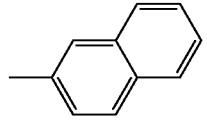

Formula (7-11)

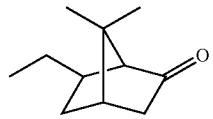

Here, R¹ is exemplified by the above described alkyl groups, aryl groups, halogenated alkyl groups, halogenated aryl groups or alkenyl groups, organic groups having an acryloyl group or a methacryloyl group.

The cyclic ether compound which reacts with the sulfonamide group-containing hydrolyzable silane of above formula (5) is exemplified by the following.

Formula (8-1)

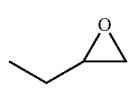

Formula (8-2)

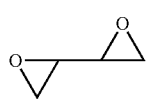

Formula (8-3)

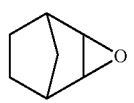

Formula (8-4)

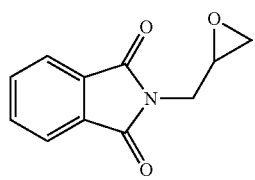

Formula (8-5)

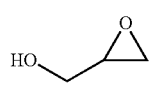

Formula (8-6)

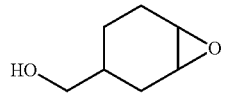

Formula (8-7)

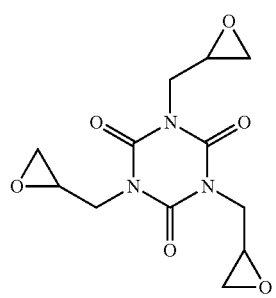

It is also possible to react the above cyclic ether group-containing hydrolyzable silane compound with the above sulfonamide group-containing hydrolyzable silane compound.

The compound of formula (1) obtained by reacting a cyclic ether with a sulfonamide is exemplified by the following.

Formula (9-1)

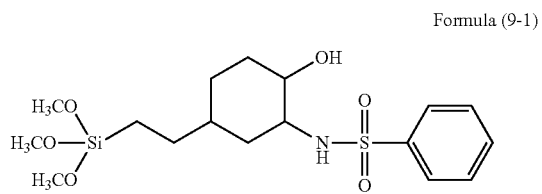

Formula (9-2)

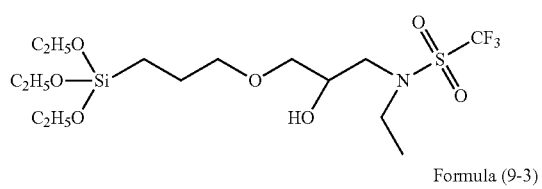

Formula (9-3)

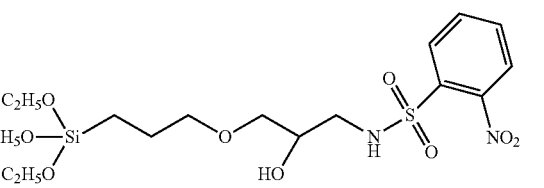

Formula (9-4)

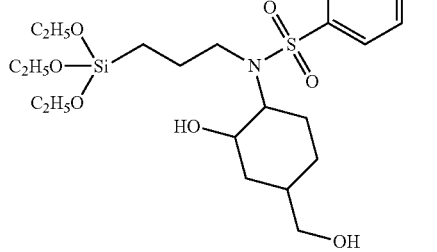

Formula (9-5)

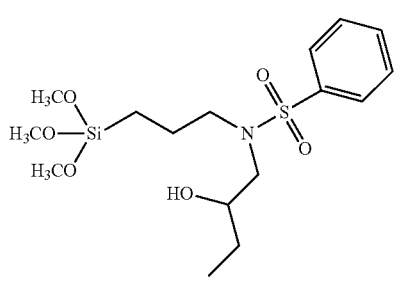

Formula (9-6)

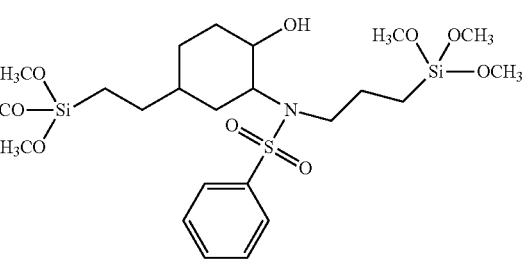

In this present invention, a hydrolyzable organosilane of formula (1) and at least one silicon-containing compound selected from the group consisting of compounds of formula (3) or (4) may be used together.

That is, a hydrolyzable organosilane of formula (1), a hydrolyzate thereof or a hydrolytic condensation product thereof, and at least one silicon-containing compound selected from the group of compounds of formulas (3) and (4), a hydrolyzate thereof or a hydrolytic condensation product thereof may be used together.

The above-described hydrolyzable organosilane of formula (1) and the silicon-containing compounds of formula (3) and/or formula (4) may be used in relative proportions, expressed as a molar ratio, in a range of between 1:0 and 1:100,000. The silicon-containing compound selected from the group of compounds of formulas (3) and (4) is preferably a silicon-containing compound of formula (3).

These are preferably used as a hydrolytic condensation product (polyorganosiloxane), with the use of a hydrolytic condensation product (polyorganosiloxane) of the hydrolyzable organosilane of formula (1) with the silicon-containing compound of formula (3) being preferred.

The alkyl groups, aryl groups, halogenated alkyl groups, halogenated aryl groups, alkenyl groups or the organic groups having an epoxy group, an acryloyl group, a methacryloyl group, a mercapto group or a cyano group of $R^7$, $R^8$, $R^9$ and $R^{10}$ in the silicon-containing compounds of formulas (3) and (4), and also the alkoxy groups, acyloxy groups or halogen atoms included in the hydrolyzable groups are exemplified by the same groups as mentioned above for formula (1).

Illustrative examples of the silicon-containing compound of formula (3) include tetramethoxysilane, tetrachlorosilane, tetraacetoxysilane, tetraethoxysilane, tetra-n-propoxysilane, tetraisopropoxysilane, tetra-n-butoxysilane, methyltrimethoxysilane, methyltrichlorosilane, methyltriacetoxysilane, methyltripropoxysilane, methyltriacetoxysilane, methyltributoxysilane, methyltriamyloxysilane, methyltriphenoxysilane, methyltribenzyloxysilane, methyltriphenetyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3-,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldiethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxsyilane, ethyltriethoxysilane, vinyltrimethoxysilane, vinyltrichlorosilane, vinyltriacetoxysilane, vinyltriethoxysilane, phenyltrimethoxysilane, phenyltrichlorosilane, phenyltriacetoxysilane, phenyltriethoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenetyltrimethoxysilane, methoxyphenetyltriethoxysilane, methoxyphenetyltriacetoxysilane, methoxyphenetyltrichlorosilane, ethoxyphenyltrimethoxylsilane, ethoxyphenyltriethoxysilane, ethoxyphenyltriacetoxysilane, ethoxyphenyl-trichlorosilane, ethoxybenzyltrimethoxysilane, ethoxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimethoxysilane, isopropoxybenzyltriethoxysilane, isopropoxybenzyltriacetoxysilane, isopropoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane and methylvinyldiethoxysilane.

Illustrative examples of the silicon-containing compound of formula (4) include methylenebis(trimethoxysilane), methylenebis(trichlorosilane), methylenebis(triacetoxysilane), ethylenebis(triethoxysilane), ethylenebis(trichlorosilane), ethylenebis(triacetoxysilane), propylenebis(triethoxysilane), butylenebis(trimethoxysilane), phenylenebis(trimethoxysilane), phenylenebis(triethoxysilane), phenylenebis(methyldiethoxysilane), phenylenebis(methyldimethoxysilane), naphthylenebis(trimethoxysilane), bis(trimethoxydisilane), bis(triethoxydisilane), bis(ethyldiethoxydisilane) and bis(methyldimethoxydisilane).

Examples of the unit structure of hydrolytic condensation products of the hydrolyzable organosilane of formula (1) and the silicon-containing compound of formula (3) include the following.

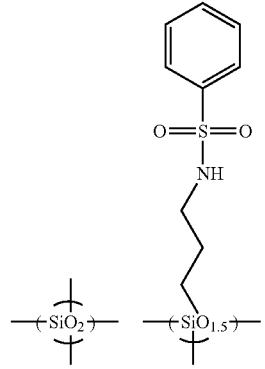

Formula (10-1)

Formula (10-2)
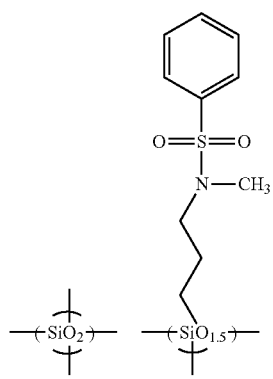
Formula (10-3)
Formula (10-4)
Formula (10-5)
Formula (10-6)
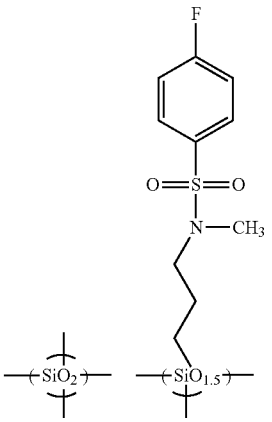
Formula (10-7)
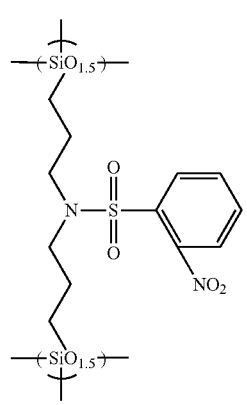
Formula (10-8)
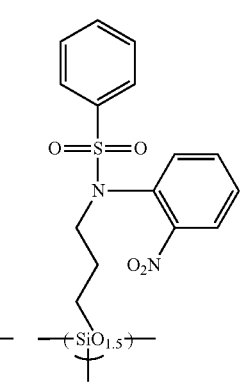
Formula (10-9)
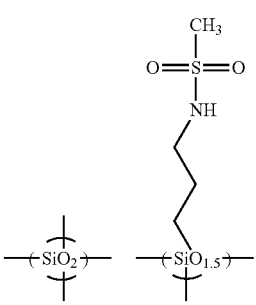

Formula (10-10)
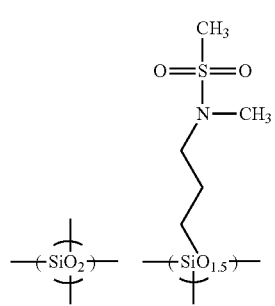
Formula (10-11)
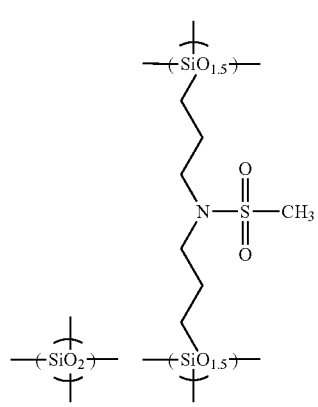
Formula (10-12)
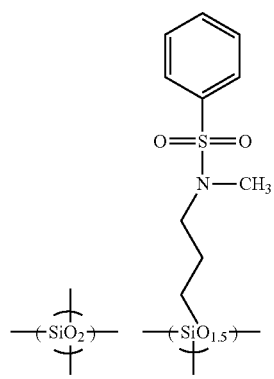
Formula (10-13)
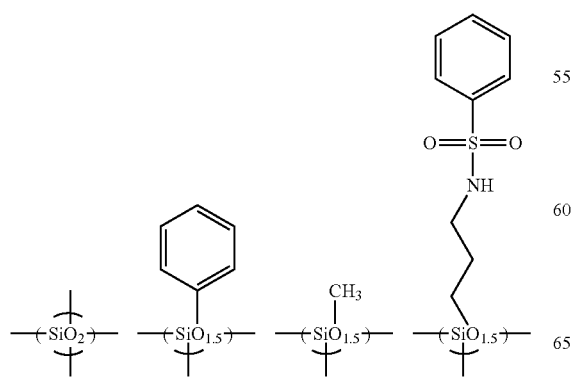
Formula (10-14)
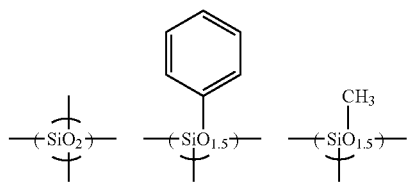
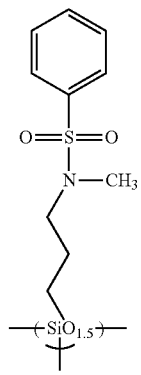
Formula (10-15)
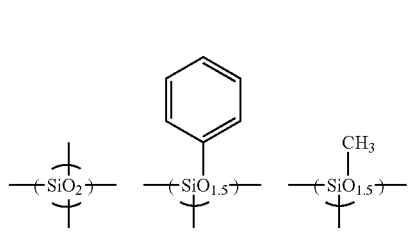
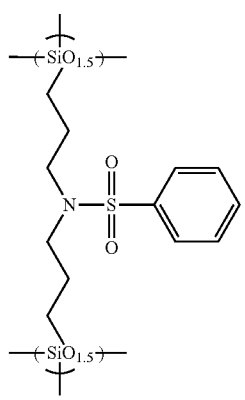
Formula (10-16)
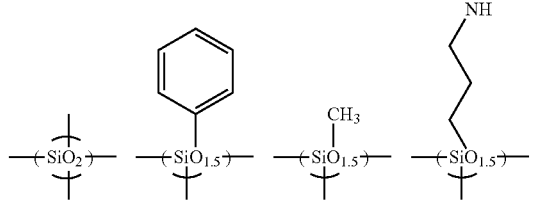

Formula (10-17)

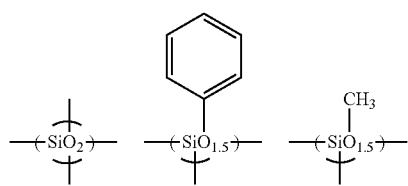

Formula (10-18)

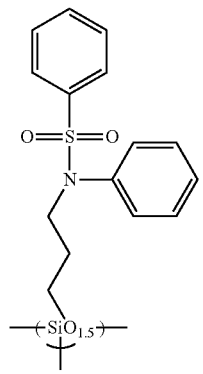

Formula (10-19)

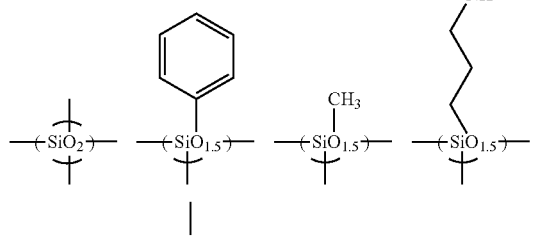

Formula (10-20)

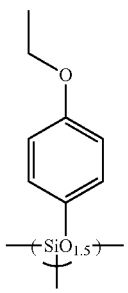

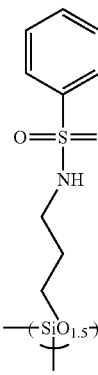

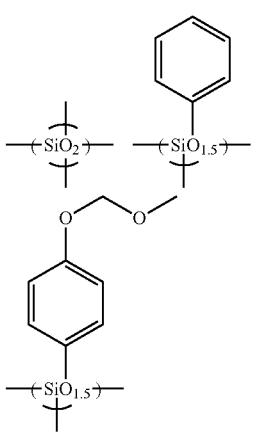

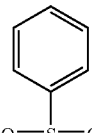

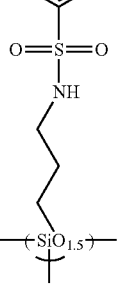

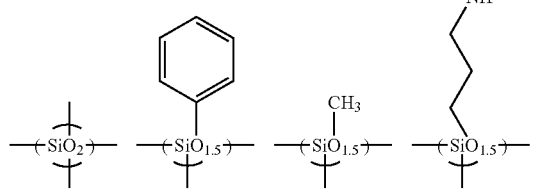

The hydrolytic condensation product (polyorganosiloxane) of the hydrolyzable organosilane of formula (1) or the hydrolytic condensation product (polyorganosiloxane) of the hydrolyzable organosilane of formula (1) and the organosilicon compound of formula (3) and/or formula (4) may be a condensation product having a weight-average molecular weight of from 1,000 to 1,000,000, or from 1,000 to 100,000. These molecular weights are polystyrene-equivalent molecular weights obtained by gel permeation chromatographic (GPC) analysis.

GPC measurement may be carried out using, for example, a GPC system (available from Tosoh Corporation under the trade name HLC-8220 GPC), a GPC column (available from Showa Denko under the trade names Shodex KF803L, KF802 and KF801), a column temperature of 40° C., tetrahydrofuran as the eluant (eluting solvent), a flow rate of 1.0 mL/min, and polystyrene (available from Showa Denko K.K.) as the standard sample.

Hydrolysis of the alkoxysilyl groups, acyloxysilyl groups or halogenated silyl groups is achieved by using from 0.5 to 100 moles, and preferably from 1 to 10 moles, of water per mole of the hydrolyzable groups.

From 0.001 to 10 moles, and preferably from 0.001 to 1 mole, of hydrolysis catalyst per mole of the hydrolyzable groups may be used.

The reaction temperature when carrying out hydrolysis and condensation is generally from 20 to 80° C.

Hydrolysis may involve either carrying out hydrolysis to completion, or partial hydrolysis. That is, hydrolyzate and monomer may remain in the hydrolytic condensation product. A catalyst may be used when effecting hydrolysis and condensation.

The hydrolysis catalyst is exemplified by metal chelate compounds, organic acids, inorganic acids, organic bases and inorganic bases.

Examples of metal chelate compounds which may be used as the hydrolysis catalyst include titanium chelate compounds such as triethoxymono(acetylacetonato)titanium, tri-n-propoxymono(acetylacetonato)titanium, tri-i-propoxymono(acetylacetonato)titanium, tri-n-butoxymono(acetylacetonato)titanium, tri-sec-butoxymono(acetylacetonato)titanium, tri-t-butoxymono(acetylacetonato)titanium, diethoxybis(acetylacetonato)titanium, di-n-propoxybis(acetylacetonato)titanium, di-i-propoxybis(acetylacetonato)titanium, di-n-butoxybis(acetylacetonato)titanium, di-sec-butoxybis(acetylacetonato)titanium, di-t-butoxybis(acetylacetonato)titanium, monoethoxytris(acetylacetonato)titanium, mono-n-propoxytris(acetylacetonato)titanium, mono-i-propoxytris(acetylacetonato)titanium, mono-n-butoxytris(acetylacetonato)titanium, mono-sec-butoxytris(acetylacetonato)titanium, mono-t-butoxytris(acetylacetonato)titanium, tetrakis(acetylacetonato)titanium, triethoxymono(ethyl acetoacetate)titanium, tri-n-propoxymono(ethyl acetoacetate)titanium, tri-i-propoxymono(ethyl acetoacetate)titanium, tri-n-butoxymono(ethyl acetoacetate)titanium, tri-sec-butoxymono(ethyl acetoacetate)titanium, tri-t-butoxymono(ethyl acetoacetate)titanium, diethoxybis(ethyl acetoacetate)titanium, di-n-propoxybis(ethylacetoacetate)titanium, di-i-propoxybis(ethyl acetoacetate)titanium, di-n-butoxybis(ethyl acetoacetate)titanium, di-sec-butoxybis(ethyl acetoacetate)titanium, di-t-butoxybis(ethyl acetoacetate)titanium, monoethoxytris(ethyl acetoacetate)titanium, mono-n-propoxytris(ethylacetoacetate)titanium, mono-i-propoxytris(ethyl acetoacetate)titanium, mono-n-butoxytris(ethyl acetoacetate)titanium, mono-sec-butoxytris(ethyl acetoacetate)titanium, mono-t-butoxytris(ethyl acetoacetate)titanium, tetrakis(ethyl acetoacetate)titanium, mono(acetylacetonato)tris(ethyl acetoacetate)titanium, bis(acetylacetonato)bis(ethyl acetoacetate)titanium and tris(acetylacetonato)mono(ethyl acetoacetate)titanium; zirconium chelate compounds such as triethoxymono(acetylacetonato)zirconium, tri-n-propoxymono(acetylacetonato)zirconium, tri-i-propoxymono(acetylacetonato)zirconium, tri-n-butoxymono(acetylacetonato)zirconium, tri-sec-butoxymono(acetylacetonato)zirconium, tri-t-butoxymono(acetylacetonato)zirconium, diethoxybis(acetylacetonato)zirconium, di-n-propoxybis(acetylacetonato)zirconium, di-i-propoxybis(acetylacetonato)zirconium, di-n-butoxybis(acetylacetonato)zirconium, di-sec-butoxybis(acetylacetonato)zirconium, di-t-butoxybis(acetylacetonato)zirconium, monoethoxytris(acetylacetonato)zirconium, mono-n-propoxytris(acetylacetonato)zirconium, mono-i-propoxytris(acetylacetonato)zirconium, mono-n-butoxytris(acetylacetonato)zirconium, mono-sec-butoxytris(acetylacetonato)zirconium, mono-t-butoxytris(acetylacetonato)zirconium, tetrakis(acetylacetonato)zirconium, triethoxymono(ethyl acetoacetate)zirconium, tri-n-propoxymono(ethyl acetoacetate)zirconium, tri-i-propoxymono(ethyl acetoacetate)zirconium, tri-n-butoxymono(ethyl acetacetate)zirconium, tri-sec-butoxymono(ethyl acetoacetate)zirconium, tri-t-butoxymono(ethyl acetoacetate)zirconium, diethoxybis(ethyl acetoacetate)zirconium, di-n-propoxybis(ethyl acetoacetate)zirconium, di-i-propoxybis(ethyl acetoacetate)zirconium, di-n-butoxybis(ethyl acetoacetate)zirconium, di-sec-butoxybis(ethyl acetoacetate)zirconium, di-t-butoxybis(ethyl acetoacetate)zirconium, monoethoxytris(ethyl acetoacetate)zirconium, mono-n-propoxytris(ethyl acetoacetate)zirconium, mono-i-propoxytris(ethyl acetoacetate)zirconium, mono-n-butoxytris(ethyl acetoacetate)zirconium, mono-sec-butoxytris(ethyl acetoacetate)zirconium, mono-t-butoxytris(ethyl acetoacetate)zirconium, tetrakis(ethyl acetoacetate)zirconium, mono(acetyloacetonato)tris(ethyl acetoacetate)zirconium, bis(acetylacetonato)bis(ethyl acetoacetate)zirconium and tris(acetylacetonato)mono(ethyl acetoacetate)zirconium; and aluminum chelate compounds such as tris(acetylacetonato)aluminum and tris(ethyl acetoacetate)aluminum.

Examples of organic acids which may be used as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid and tartaric acid.

Examples of inorganic acids which may be used as the hydrolysis catalyst include hydrochloric acid, nitric acid, sulfuric acid, hydrofluoric acid and phosphoric acid.

Examples of organic bases that may be used as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene and tetramethylammonium hydroxide. Examples of inorganic bases include ammonia, sodium hydroxide, potassium hydroxide, barium hydroxide and calcium hydroxide. Of these catalysts, a metal chelate compound, an organic acid and an inorganic acid are preferred. These may be used singly or two or more may be used at the same time.

Examples of organic solvents which may be used in hydrolysis include aliphatic hydrocarbon-type solvents such as n-pentane, i-pentane, n-hexane, i-hexane, n-heptane, i-heptane, 2,2,4-trimethylpentane, n-octane, i-octane, cyclohexane and methylcyclohexane; aromatic hydrocarbon-type solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene and trimethylbenzene; monoalcohol-type solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-heptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol and cresol; polyhydric alcohol-type solvents such as ethylene glycol, propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol and glycerol; ketone-type solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-1-butyl ketone, trimethyl nonanone, cyclohexanone, methyl cyclohexanone, 2,4-pentanedione, acetonylacetone, diacetone alcohol, acetophenone and fenchone; ether-type solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycyol monopropyl ether, dipropylene glycol monobutyl ether, tripropylene glycol monomethyl ether, tetrahydrofuran and 2-methyltetrahydrofuran; ester-type solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide and N-methylpyrrolidone; and sulfur-containing solvents such as dimethyl sulfide, diethyl sulfide, thiophene, tetrahydrothiophene, dimethylsulfoxide, sulfolane and 1,3-propanesultone. These solvents may be used singly or as combinations of two or more thereof.

The use of a ketone-type solvent such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-1-butyl ketone, trimethyl nonanone, cyclohexanone, methyl cyclohexanone, 2,4-pentanedione, acetonylacetone, diacetone alcohol, acetophenone and fenchone is especially preferred from the standpoint of storage stability of the solution.

The resist underlayer film-forming composition of the present invention may include a curing catalyst. The curing catalyst functions as a curing catalyst when an applied film containing a polyorganosiloxane composed of a hydrolytic condensation product is heated to effect curing.

Ammonium salts, phosphines, phosphonium salts and sulfonium salts may be used as the curing catalyst.

Ammonium salts are exemplified by quaternary ammonium salts having the structure in formula (D-1)

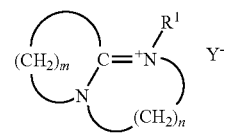

Formula (D-1)

(where m is an integer from 2 to 11, n is the integer 2 or 3, $R^1$ is an alkyl group or an aryl group, and $Y^-$ is an anion); quaternary ammonium salts having the structure in formula (D-2)

$R^2R^3R^4R^5N^+Y^-$  Formula (D-2)

(where $R^2$, $R^3$, $R^4$ and $R^5$ are alkyl groups or aryl groups; N is a nitrogen atom; $Y^-$ is an anion; and $R^2$, $R^3$, $R^4$ and $R^5$ are each bonded to the nitrogen atom by a C—N bond); quaternary ammonium salts having the structure in formula (D-3)

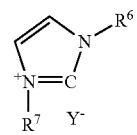

Formula (D-3)

(where $R^6$ and $R^7$ are alkyl groups or aryl groups, and $Y^-$ is an anion); quaternary ammonium salts having the structure in formula (D-4)

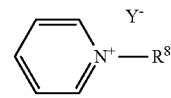

Formula (D-4)

(where $R^8$ is an alkyl group or an aryl group, and $Y^-$ is an anion); quaternary ammonium salts having the structure in formula (D-5)

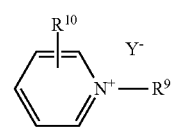

Formula (D-5)

(where $R^9$ and $R^{10}$ are alkyl groups or aryl groups, and $Y^-$ is an anion); and tertiary ammonium salts having the structure in formula (D-6)

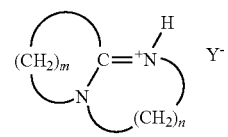

Formula (D-6)

(where m is an integer from 2 to 11, n is the integer 2 or 3, H is a hydrogen atom, and $Y^-$ is an anion).

Phosphonium salts are exemplified by quaternary phosphonium salts of formula (D-7)

$$R^{11}R^{12}R^{13}R^{14}P^+Y^-$$ Formula (D-7)

(where $R^{11}$, $R^{12}$, $R^{13}$ and $R^{14}$ are alkyl groups or aryl groups; P is a phosphorus atom; $Y^-$ is an anion; and $R^{11}$, $R^{12}$, $R^{13}$ and $R^{14}$ are each bonded to the phosphorus atom by a C—P bond)

Sulfonium salts are exemplified by tertiary sulfonium salts of formula (D-8)

$$R^{15}R^{16}R^{17}S^+Y^-$$ Formula (D-8)

(where $R^{15}$, $R^{16}$ and $R^{17}$ are alkyl groups or aryl groups; S is a sulfur atom; $Y^-$ is an anion; and $R^{15}$, $R^{16}$ and $R^{17}$ are each bonded to the sulfur atom by a C—S bond).

The compound of above formula (D-1) is a quaternary ammonium salt derived from an amine, with "m" being an integer from 2 to 11 and "n" being the integer 2 or 3. $R^1$ in this quaternary ammonium salt is a $C_{1-18}$, preferably $C_{2-10}$ alkyl group or aryl group, illustrative examples of which include linear alkyl groups such as an ethyl group, a propyl group and a butyl group, and also a benzyl group, a cyclohexyl group, a cyclohexylmethyl group and a dicyclopentadienyl group. Illustrative examples of the anion ($Y^-$) include halogen ions such as a chloride ion ($Cl^-$), bromide ion ($Br^-$) or iodide ion ($I^-$), and acid radicals such as carboxylate (—$COO^-$), sulfonato (—$SO_3^-$) and alcoholate (—$O^-$).

The compound of above formula (D-2) is a quaternary ammonium salt represented as $R^2R^3R^4R^5N^+Y^-$. $R^2$, $R^3$, $R^4$ and $R^5$ in this quaternary ammonium salt are $C_{1-18}$ alkyl groups or aryl groups, or are silane compounds bonded to a silicon atom by Si—C bonds. Illustrative examples of the anion ($Y^-$) include halogen ions such as a chloride ion ($Cl^-$), bromide ion ($Br^-$) or iodide ion ($I^-$), and acid radicals such as carboxylate (—COO), sulfonato (—$SO_3$) and alcoholate (—$O^-$), This quaternary ammonium salt may be acquired as a commercial product. Illustrative examples include tetramethylammonium acetate, tetrabutylammonium acetate, triethylbenzylammonium chloride, triethylbenzyl ammonium bromide, trioctylmethylammonium chloride, tributylbenzylammonium chloride and trimethylbenzylammonium chloride.

The compound of above formula (D-3) is a quaternary ammonium salt derived from a 1-substituted imidazole, with $R^6$ and $R^7$ being $C_{1-18}$, and the total number of carbon atoms on $R^6$ and $R^7$ being preferably at least 7. Examples of $R^6$ include a methyl group, an ethyl group, a propyl group, a phenyl group and a benzyl group; examples of $R^7$ include a benzyl group, an octyl group and an octadecyl group. Examples of the anion ($Y^-$) include halogen ions such as a chloride ion ($Cl^-$), bromide ion ($Br^-$) or iodide ion ($I^-$), and acid radicals such as carboxylate (—COO), sulfonato (—$SO_3$) and alcoholate (—$O^-$). This compound may be acquired as a commercial product, or may be prepared by reacting an imidazole compound such as 1-methylimidazole and 1-benzylimidazole with an alkyl halide or aryl halide such as benzyl bromide and methyl bromide.

The compound of above formula (D-4) is a quaternary ammonium salt derived from pyridine, with $R^8$ being a $C_{1-18}$, preferably a $C_{4-18}$, alkyl group or aryl group, examples of which include a butyl group, an octyl group, a benzyl group and a lauryl group. Examples of the anion ($Y^-$) include halogen ions such as a chloride ion ($Cl^-$), bromide ion ($Br^-$) or iodide ion ($I^-$), and acid radicals such as carboxylate (—$COO^-$), sulfonato (—$SO_3$) and alcoholate (—$O^-$). This compound may be acquired as a commercial product, or may be prepared by reacting pyridine or the like with an alkyl halide or aryl halide, such as lauryl chloride, benzyl chloride, benzyl bromide, methyl bromide or octyl bromide. Illustrative examples of this compound include N-laurylpyridinium chloride and N-benzylpyridinium bromide.

The compound of above formula (D-5) is a quaternary ammonium salt derived from a substituted pyridine such as picoline, with $R^9$ being a $C_{1-18}$, preferably a $C_{4-18}$, alkyl group or aryl group, examples of which include a methyl group, an octyl group, a lauryl group and a benzyl group. $R^{10}$ is a $C_{1-18}$ alkyl group or aryl group. For example, in the case of a quaternary ammonium derived from picoline, $R^{10}$ is a methyl group. Examples of the anion ($Y^-$) include halogen ions such as a chloride ion ($Cl^-$), bromide ion ($Br^-$) or iodide ion ($I^-$), and acid radicals such as carboxylate (—$COO^-$), sulfonato (—$SO_3^-$) and alcoholate (—$O^-$). This compound may be acquired as a commercial product, or may be prepared by reacting a substituted pyridine such as picoline with an alkyl halide or aryl halide such as methyl bromide, octyl bromide, lauryl chloride, benzyl chloride or benzyl bromide. Illustrative examples of this compound include N-benzylpicolinium chloride, N-benzylpicolinium bromide and N-laurylpicolinium chloride.

The compound of above formula (D-6) is a tertiary ammonium salt derived from an amine, with "m" being an integer from 2 to 11 and "n" being the integer 2 or 3. Examples of the anion ($Y^-$) include halogen ions such as a chloride ion ($Cl^-$), bromide ion ($Br^-$) or iodide ion ($I^-$), and acid radicals such as carboxylate (—$COO^-$), sulfonato (—$SO_3^-$) and alcoholate (—$O^-$). This compound may be prepared by reacting an amine with a weak acid such as a carboxylic acid or phenol. Examples of carboxylic acids include formic acid and acetic acid. When formic acid is used, the anion (Y) is ($HCOO^-$); when acetic acid is used, the anion ($Y^-$) is ($CH_3COO^-$); and when phenol is used, the anion ($Y^-$) is ($C_6H_5O^-$).

The compound of above formula (D-7) is a quaternary phosphonium salt having the structure $R^{11}R^{12}R^{13}R^{14}P^+Y^-$. $R^{11}$, $R^{12}$, $R^{13}$ and $R^{14}$ are $C_{1-18}$ alkyl groups or aryl groups, or are silane compounds bonded to a silicon atom by a Si—C bond. Preferably, three of the four substituents $R^{11}$ to $R^{14}$ are phenyl groups or substituted phenyl groups, illustrative examples of which are a phenyl group and a tolyl group, with the remaining substituent being either a $C_{1-18}$ alkyl group or aryl group or a silane compound which is bonded to a silicon atom via a Si—C bond. Examples of the anion ($Y^-$) include halogen ions such as a chloride ion ($Cl^-$), bromide ion ($Br^-$) or iodide ion ($I^-$), and acid radicals such as carboxylate (—$COO^-$), sulfonato (—$SO_3^-$) and alcoholate (—$O^-$). This compound may be acquired as a commercial product. Illustrative examples include tetralkylphosphonium halides such as tetra-n-butylphosphonium halides and tetra-n-propylphosphonium halides; trialkylbenzylphosphonium halides such as triethylbenzylphosphonium halides; triphenylmonoalkylphosphonium halides such as triphenylmethylphosphonium halides and triphenylethylphosphonium halides; and triphenylbenzylphosphonium halides, tetraphenylphosphonium halides, tritolylmonoarylphosphonium halides and tritolylmonoalkylphosphonium halides (the halogen atom being a chlorine atom or a bromine atom). Especially preferred examples include triphenylmonoalkylphosphonium halides such as triphenylmethylphosphonium halides and triphenylethylphosphonium halides, triphenylmonoarylphosphonium halides such as triphenylbenzylphosphonium halides, tritolylmonoarylphosphonium halides such as tritolylmonophenylphosphonium halides, and tritolylmonoalkylphosphonium halides such as tritolylmonomethylphosphonium halides (the halogen atom being a chlorine atom or bromine atom).

Illustrative examples of phosphines include primary phosphines such as methylphosphine, ethylphosphine, propylphosphine, isopropylphosphine, isobutylphosphine and phenylphosphine; secondary phosphines such as dimethylphosphine, diethylphosphine, diisopropylphosphine, diisoamylphosphine and diphenylphosphine; and tertiary phosphines such as trimethylphosphine, triethylphosphine, triphenylphosphine, methyldiphenylphosphine and dimethylphenylphosphine.

The compound of above formula (D-8) is a tertiary sulfonium salt having the structure $R^{15}R^{16}R^{17}S^+Y^-$. $R^{15}$, $R^{16}$ and $R^{17}$ are each a $C_{1-18}$ alkyl group or aryl group, or a silane compound bonded to a silicon atom by a Si—C bond. Preferably, three of the four substituents $R^{15}$ to $R^{17}$ are phenyl groups or substituted phenyl groups, illustrative examples of which are a phenyl group and a tolyl group, with the remaining substituent being a $C_{1-18}$ alkyl group or aryl group. Examples of the anion ($Y^-$) include halogen ions such as a chloride ion ($Cl^-$), bromide ion ($Br^-$) or iodide ion ($I^-$), and acid radicals such as carboxylate (—COO), sulfonato (—$SO_3^-$) and alcoholate (—$O^-$). This compound may be acquired as a commercial product. Illustrative examples include tetraalkylsulfonium halides such as tri-n-butylsulfonium halides and tri-n-propylsulfonium halides, trialkylbenzylsulfonium halides such as diethylbenzylsulfonium halides, diphenylmonoalkylsulfonium halides such as diphenylmethylsulfonium halides and diphenylethylsulfonium halides, and triphenylsulfonium halides (the halogen atom being a chlorine atom or bromine atom), tetraalkylphosphonium carboxylates such as tri-n-butylsulfonium carboxylate and tri-n-propylsulfonium carboxylate; trialkylbenzylsulfonium carboxylates such as diethylbenzylsulfonium carboxylate; diphenylmonoalkylsulfonium carboxylates such as diphenylmethylsulfonium carboxylate and diphenylethylsulfonium carboxylate, triphenylsulfonium carboxylates, and triphenylsulfonium maleate. Triphenylsulfonium halides and triphenylsulfonium carboxylates are especially preferred.

In addition, an amine may be added. For example, N-(3-triethoxysilylpropyl)-4,5-dihydroimidazole may be added.

The curing catalyst is included in an amount of between 0.01 and 10 parts by mass, between 0.01 and 5 parts by mass, or between 0.01 and 3 parts by mass, per 100 parts by mass of the polyorganosiloxane.

The hydrolyzable organosilane is hydrolyzed and condensed in a solvent using a catalyst, and by-product alcohol, the hydrolysis catalyst used and water may be removed from the resulting hydrolytic condensation product (polymer) by, for example, vacuum distillation. The acid or base catalyst used in hydrolysis may be removed by neutralization or ion exchange. Moreover, in the lithographic resist underlayer film-forming composition of the present invention, an organic acid, water, alcohol or a combination thereof may be added to this hydrolytic condensation product-containing resist underlayer film-forming composition for the sake of stabilization.

Illustrative examples of the organic acid include oxalic acid, malonic acid, methylmalonic acid, succinic acid, maleic acid, malic acid, tartaric acid, phthalic acid, citric acid, glutaric acid, citric acid, lactic acid and salicylic acid. Of these, oxalic acid and maleic acid are preferred. The organic acid is added in an amount of from 0.1 to 5.0 parts by mass per 100 parts by mass of the condensation product (polyorganosiloxane). Pure water, ultrapure water, ion-exchanged water or the like may be used as the water that is added, and the amount of such addition per 100 parts by mass of the resist underlayer film-forming composition may be set to from 1 to 20 parts by mass.

The alcohol added is preferably one which readily vaporizes on heating following application, such as methanol, ethanol, propanol, isopropanol or butanol. The amount of alcohol added per 100 parts by mass of the resist underlayer film-forming composition may be set to from 1 to 20 parts by mass.

In addition to the ingredients described above, where necessary, the lithographic underlayer film-forming composition of the present invention may also include such ingredients as an organic polymer compound, a photoacid generator and a surfactant.

By using an organic polymer compound, it is possible to adjust the dry etch rate (amount of reduction in film thickness per unit time), attenuation coefficient, refractive index and other properties of the resist underlayer film that forms from the lithographic underlayer film-forming composition according to the present invention.

Various organic polymers may be used without particular limitation as the organic polymer compound. Polycondensation polymers and polyaddition polymers may be used. Use may be made of polyaddition polymers and polycondensation polymers such as polyesters, polystyrenes, polyimides, acrylic polymers, methacrylic polymers, polyvinyl ether, phenolic novolak, naphthol novolak, polyethers, polyamides and polycarbonates. The use of an organic polymer having an aromatic ring structure such as a benzene ring, naphthalene ring, anthracene ring, triazine ring, quinoline ring or quinoxaline ring which functions as the light-absorbing moiety is preferred.

Examples of such organic polymer compounds include polyaddition polymers containing as the structural units addition polymerizable monomers such as benzyl acrylate, benzyl methacrylate, phenyl acrylate, naphthyl acrylate, anthryl methacrylate, anthryl methyl methacrylate, styrene, hydroxystyrene, benzyl vinyl ether and N-phenylmaleimide, and polycondensation polymers such as phenol novolak and naphthol novolak.

In cases where a polyaddition polymer is used as the organic polymer compound, the polymer compound may be a homopolymer or a copolymer. An addition polymerizable monomer is used to prepare the polyaddition polymer. Examples of such addition polymerizable monomers include acrylic acid, methacrylic acid, acrylic acid ester compounds, methacrylic acid ester compounds, acrylamide compounds, methacrylamide compounds, vinyl compounds, styrene compounds, maleimide compounds, maleic acid anhydride and acrylonitrile.

Illustrative examples of acrylic acid ester compounds include methyl acrylate, ethyl acrylate, n-hexyl acrylate, isopropyl acrylate, cyclohexyl acrylate, benzyl acrylate, phenyl acrylate, anthryl methyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic acid 6-lactone, 3-acryloxypropyltriethoxysilane and glycidyl acrylate.

Illustrative examples of methacrylic acid ester compounds include methyl methacrylate, ethyl methacrylate, n-hexyl methacrylate, isopropyl methacrylate, cyclohexyl methacrylate, benzyl methacrylate, phenyl methacrylate, anthryl methyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6- hydroxynorbornene-2-carboxylic acid 6-lactone, 3-methacryloxypropyltriethoxysilane, glycidyl methacrylate, 2-phenylethyl methacrylate, hydroxyphenyl methacrylate and bromophenyl methacrylate.

Examples of acrylamide compounds include acrylamide, N-methyl acrylamide, N-ethyl acrylamide, N-benzyl acrylamide, N-phenyl acrylamide, N,N-dimethyl acrylamide and N-anthryl acrylamide.

Examples of methacrylamide compounds include methacrylamide, N-methyl methacrylamide, N-ethyl methacrylamide, N-benzyl methacrylamide, N-phenyl methacrylamide, N,N-dimethyl methacrylamide and N-anthryl acrylamide.

Examples of vinyl compounds include vinyl alcohol, 2-hydroxyethyl vinyl ether, methyl vinyl ether, ethyl vinyl ether, benzyl vinyl ether, vinyl acetate, vinyl trimethoxysilane, 2-chloroethyl vinyl ether, 2-methoxyethyl vinyl ether, vinyl naphthalene and vinyl anthracene.

Examples of styrene compounds include styrene, hydroxystyrene, chlorostyrene, bromostyrene, methoxystyrene, cyanostyrene and acetyl styrene.

Examples of maleimide compounds include maleimide, N-methyl maleimide, N-phenyl maleimide, N-cyclohexyl maleimide, N-benzyl maleimide and N-hydroxyethyl maleimide.

In cases where a polycondensation polymer is used as the polymer, such polymers are exemplified by polycondensation polymers of a glycol compound with a dicarboxylic acid compound. Examples of the glycol compound include diethylene glycol, hexamethylene glycol and butylene glycol. Examples of the dicarboxylic acid compound include succinic acid, adipic acid, terephthalic acid and maleic anhydride, Additional examples include polyesters, polyamides and polyimides such as polypyromellitimide, poly(p-phenylene terephthalamide), polybutylene terephthalate and polyethylene terephthalate.

In cases where a hydroxyl group is included in the organic polymer compound, this hydroxyl group may give rise to a crosslinking reaction with a polyorganosiloxane.

A polymer compound having a weight-average molecular weight of, for example, from 1,000 to 1,000,000, from 3,000 to 300,000, from 5,000 to 200,000, or from 10,000 to 100,000, may be used as the organic polymer compound.

One organic polymer compound may be used alone, or a combination of two or more may be used together.

When an organic polymer compound is used, the proportion per 100 parts by mass of the condensation product (polyorganosiloxane) is from 1 to 200 parts by mass, from 5 to 100 parts by mass, from 10 to 50 parts by mass, or from 20 to 30 parts by mass.

The resist underlayer film-forming composition of the present invention may include an acid generator.

The acid generator is exemplified by thermal acid generators and photoacid generators.

A photoacid generator forms an acid when the resist is exposed to light. As a result, the degree of acidity of the underlayer film can be adjusted. This is one way of making the acidity of the underlayer film agree with the acidity of the overlying resist. In addition, by adjusting the acidity of the underlayer film, it is possible to adjust the shape of the resist pattern that is formed as the overlying layer.

The photoacid generator included in the resist underlayer film-forming composition of the present invention is exemplified by onium salt compounds, sulfonimide compounds and disulfonyl diazomethane compounds.

Illustrative examples of onium salt compounds include iodonium salt compounds such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate and bis(4-tert-butylphenyl)iodonium trifluoromethanesulfonate; and sulfonium salt compounds such as triphenylsulfonium hexafluoroantimonate, triphenylsulfonium nonafluoro-n-butanesulfonate, triphenylsulfonium camphorsulfonate and triphenylsulfonium trifluoromethanesulfonate.

Illustrative examples of sulfonimide compounds include N-(trifluoromethanesulfonyloxy)succinimide, N-(nonafluoro-n-butanesulfonyloxy)succinimide, N-(camphorsulfonyloxy)succinimide and N-(trifluoromethanesulfonyloxy)naphthylimide.

Illustrative examples of disulfonyldiazomethane compounds include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane and methylsulfonyl-p-toluenesulfonyldiazomethane.

A single photoacid generator may be used, or a combination of two or more may be used.

When a photoacid generator is used, the proportion per 100 parts by mass of the condensation product (polyorganosiloxane) is from 0.01 to 5 parts by mass, from 0.1 to 3 parts by mass, or from 0.5 to 1 part by mass.

A surfactant is effective for suppressing the formation of pinholes and striations when the lithographic resist underlayer film-forming composition of the present invention is coated onto a substrate.

The surfactant included in the resist underlayer film-forming composition of the present invention is exemplified by polyoxyethylene alkyl ethers such as polyoxyethylene lauryl ether, polyoxyethylene stearyl ether, polyoxyethylene cetyl ether and polyoxyethylene oleyl ether; polyoxyethylene alkylaryl ethers such as polyoxyethylene octylphenol ether and polyoxyethylene nonylphenol ether; polyoxyethylene polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; nonionic surfactants such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine-containing surfactants such as those available under the trade names Eftop EF301, EF303 and EF352 (Tochem Products Co, Ltd.), the trade names Megafac F171, F173, R-08 and R-30 (Dainippon Ink & Chemicals, Inc.), Fluorad FC430 and FC431 (Sumitomo 3M Ltd.), the trade names Asahiguard AG710 and Surflon S-382, SC101, SC102, SC103, SC104, SC105 and SC106 (Asahi Glass Co., Ltd.); and the organosiloxane polymer KP341 (Shin-Etsu Chemical Co., Ltd.). These surfactants may be used singly or may be used as combinations of two or more types. When a surfactant is used, the proportion per 100 parts by mass of the condensation product (polyorganosiloxane) is from 0.0001 to 5 parts by mass, from 0.001 to 1 part by mass, or from 0.01 to 0.5 part by mass.

Additives such as rheology modifiers and adhesion promoters may be added to the resist underlayer film-forming composition of the present invention. A rheology modifier is effective for increasing the flow properties of the underlayer film-forming composition. An adhesion promoter is effective for increasing adhesion between the semiconductor substrate or the resist and the underlayer film.

The solvent used in the resist underlayer film-forming composition of the present invention is not subject to any particular limitation, provided it is a solvent capable of dissolving the solid matter mentioned above. Illustrative examples of such solvents include methyl cellosolve acetate, ethyl cellosolve acetate, propylene glycol, propylene glycol monomethyl ether, propylene glycol monoethyl ether, methylisobutylcarbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone and γ-butyrolactone. These solvents may be used singly or two or more may be used in combination.

Next, the use of the resist underlayer film-forming composition of the present invention is explained.

The resist underlayer film-forming composition of the present invention is coated by a suitable coating method such as a spinner or coater onto a substrate (e.g., silicon wafer substrate, silicon/silicon dioxide-covered substrate, silicon nitride substrate, glass substrate, ITO substrate, polyimide substrate, low-k material-covered substrate) used in the semiconductor device fabrication, then is baked to form a resist underlayer film. The baking conditions are suitably selected from a bake temperature of from 80 to 250° C., and a bake time of from 0.3 to 60 minutes. Preferably, the bake temperature is from 150 to 250° C., and the bake time is between 0.5 and 2 minutes. Here, the thickness of the underlayer film that forms is, for example, from 10 to 1,000 nm, from 20 to 500 nm, from 50 to 300 nm, or from 100 to 200 nm.

Next, a photoresist layer is formed on top of the resist underlayer film. Formation of the photoresist layer may be carried out by a well-known process; that is, by coating then baking a photoresist composition solution on the underlayer film. The thickness of the photoresist film is, for example, from 50 to 10,000 nm, from 100 to 2,000 nm, or from 200 to 1,000 nm.

The photoresist formed on the resist underlayer film of the present invention is not subject to any particular limitation, provided it is sensitive to the light used in exposure. Either a negative photoresist or a positive photoresist may be used. Exemplary photoresists include positive photoresists composed of a novolak resin and a 1,2-naphthoquinonediazidesulfonic acid ester; chemically amplified photoresists composed of a binder having a group which is decomposed by an acid and increases the alkali dissolution rate, and a photoacid generator; chemically amplified photoresists composed of a low-molecular-weight compound which is decomposed by an acid and increases the alkali dissolution rate of the photoresist, an alkali-soluble binder, and a photoacid generator; and chemically amplified photoresists composed of a binder having a group which is decomposed by an acid and increases the alkali dissolution rate, a low-molecular-weight compound which is decomposed by an acid and increases the alkali dissolution rate of the photoresist, and a photoacid generator. Examples of such photoresists include APEX-E (product name) by Shipley Company, PAR710 (product name) by Sumitomo Chemical Company Limited, and SEPR430 (product name) by Shin-Etsu Chemical Co. Ltd. Illustrative examples include fluorine atom-containing polymer-based photoresists such as those mentioned in Proc. SPIE, Vol. 3999, 330-334 (2000); Proc. SPIE, Vol. 3999, 357-364 (2000); and Proc. SPIE, Vol. 3999, 365-374 (2000).

Next, exposure is carried out through a predetermined mask. A KrF excimer laser (wavelength, 248 nm), ArF excimer laser (wavelength, 193 nm) or $F_2$ excimer laser (wavelength, 157 nm) may be used for exposure. Following exposure, a post-exposure bake may be carried out if necessary. Post-exposure bake is carried out under conditions that have been suitably selected from a heating temperature of between 70 and 150° C. and a heating time of between 0.3 and 10 minutes.

Alternatively, in this invention, it is possible to use an electron beam lithographic resist instead of a photoresist. Either a negative-working or positive-working e-beam resist may be used. Exemplary electron beam resists include chemically amplified resists composed of an acid generator and a binder having a group which is decomposed by an acid and changes the alkali dissolution rate; chemically amplified resists composed of an alkali soluble binder, an acid generator, and a low-molecular-weight compound which is decomposed by an acid and changes the alkali dissolution rate of the resist; chemically amplified resists composed of an acid generator, a binder having a group which is decomposed by an acid and changes the alkali dissolution rate, and a low-molecular-weight compound which is decomposed by an acid and changes the alkali dissolution rate of the resist; non-chemically amplified resists composed of a binder having a group that is decomposed by electron beams and changes the alkali dissolution rate; and non-chemically amplified resists composed of a binder having a moiety that is cleaved by an electron beams and changes the alkali dissolution rate. In cases where such electron beam resists are used, by employing an electron beams as the radiation source, a resist pattern can be formed in the same way as when a photoresist is used.

Next, development is carried out with a developer. In this way, when a positive photoresist has been used, for example, photoresist in the exposed areas is removed, thereby forming a photoresist pattern.

Illustrative examples of developers include aqueous solutions of alkali metal hydroxides such as potassium hydroxide and sodium hydroxide; aqueous solutions of quaternary ammonium hydroxides such as tetramethylammonium hydroxide, tetraethylammonium hydroxide and choline; and alkaline aqueous solutions, including aqueous solutions of amines such as ethanolamine, propylamine and ethylenediamine. Surfactants and the like may be added to such developers. The development conditions are suitably selected from a temperature of between 5 and 50° C. and a time of between 10 and 600 seconds.

Next, using the photoresist (top layer) pattern formed in this way as a protective film, removal of the resist underlayer film (intermediate layer) of the present invention is carried out, after which, using the patterned photoresist and the film composed of the resist underlayer film according to the present invention (intermediate layer) as the protective films, removal of the organic underlayer film (bottom layer) is carried out. Finally, using the patterned resist underlayer film according to the present invention (intermediate layer) and organic underlayer film (bottom layer) as the protective films, processing of the semiconductor substrate is carried out.

First, the resist underlayer film (intermediate layer) of the present invention in areas where the photoresist has been removed is removed by dry etching, thereby leaving the semiconductor exposed. Gases such as tetrafluoromethane ($CF_4$), perfluorochlorobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, trichloroborane and dichloroborane may be used. It is preferable to use a halogen-containing gas in dry etching of the resist underlayer film. In dry etching with a halogen-containing gas, removal of a photoresist composed of an organic substance does not readily occur. By contrast, the resist underlayer film of the present invention which contains a large amount of silicon atoms is rapidly removed by a halogen-containing gas. Hence, it is possible to suppress a decrease in the photoresist film thickness associated with dry etching of the resist underlayer film. Moreover, because of this, it is possible to use the photoresist as a thin-film. Dry etching of the resist underlayer film is preferably carried out with a fluorine-containing gas, illustrative examples of the fluorine-containing gas being tetrafluoromethane ($CF_4$), perfluorocyclobutane ($C_4F_8$), perfluoropropane ($C_3F_8$), trifluoromethane and difluoromethane ($CH_2F_2$).

Next, using the patterned photoresist and resist underlayer film according to the present invention as protective films, removal of the organic underlayer film is carried out. Removal of the organic underlayer film (bottom layer) by dry etching with an oxygen-containing gas is preferred. The reason is that the resist underlayer film according to the present invention which contains many silicon atoms is not easily removed by dry etching with an oxygen-containing gas.

Finally, the semiconductor substrate is etched, Etching of the semiconductor substrate is preferably carried out by dry etching with a fluorine-containing gas.

Examples of the fluorine-containing gas include tetrafluoromethane ($CF_4$), perfluorocyclobutane ($C_4F_8$), perfluoropropane ($C_3F_8$), trifluoromethane and difluoromethane ($CH_2F_2$). Prior to photoresist formation, an organic anti-reflective coating may be formed over the resist underlayer film according to the present invention. The anti-reflective coating composition used in such a case is not subject to any particular limitation, although use may be made of any selected from among those conventionally used to date in lithographic processes. Moreover, formation of the anti-reflective coating may be carried out by, for example, coating with a spinner or coater, and baking.

In the present invention, following formation of an organic underlayer film on the substrate, the resist underlayer film of the present invention is formed thereon, after which the resist underlayer film may be covered with a photoresist. As a result, the pattern width of the photoresist narrows; even in cases where the photoresist is thinly coated in order to prevent pattern collapse, etching of the substrate is possible by selecting a suitable etching gas. For example, the resist underlayer film of the present invention may be processed using as the etching gas a fluorine-containing gas having a sufficiently rapid etch rate with respect to the photoresist, the organic underlayer film may be processed using as the etching gas an oxygen-containing gas having a sufficiently rapid etch rate with respect to the resist underlayer film of the present invention, and etching of the substrate may be carried out using as the etching gas a fluorine-containing gas having a sufficiently rapidly etch rate with respect to the organic underlayer film.

The substrate which is coated with the resist underlayer film-forming composition of the present invention may have on the surface thereof an organic or inorganic anti-reflective coating which has been formed by a process such as chemical vapor deposition, and the underlayer film of the present invention may be formed thereon.

Depending on the wavelength of the light used in the lithographic process, the resist underlayer film that is formed of the resist underlayer film-forming composition according to the present invention sometimes absorbs light. In such cases, it may function as an anti-reflective coating which has the effect of preventing the reflection of light from the substrate. In addition, the resist underlayer film of the present invention may be used as, for example, a layer for preventing interactions between the substrate and the photoresist, a layer which serves to prevent the material used in the photoresist or the substances that arise when the photoresist is exposed to light from adversely affecting the substrate, a layer which serves to prevent substances that arise from the substrate at the time of heating and baking from diffusing to the overlying photoresist, and a barrier layer for reducing the photoresist layer poisoning effect by the semiconductor substrate dielectric layer.

Moreover, the resist underlayer film formed with the resist underlayer film-forming composition, when applied to a substrate having via holes formed therein which is to be employed in a dual damascene process, may be used as an embedding material which is capable of filling the holes without leaving any gaps. The resist underlayer film may also be used as a planarizing material for leveling the surface of a semiconductor substrate having uneven features thereon.

The present invention is illustrated more fully below by way of examples, although the present invention is not limited by the examples.

EXAMPLES

The compounds obtained as described below were identified by $^1$H-NMR measurement under the following conditions: sample tube, 5 mm; solvent, deuterated chloroform; measurement temperature, room temperature; pulse interval, 5 seconds; integrations, 32; reference sample, tetramethylsilane (TMS).

Synthesis of Compound 1

A 100 mL three-necked flask was charged with 6.27 g of aminopropyltriethoxysilane, 3.22 g of triethylamine and 15 g of dichloromethane, and the flask contents were stirred. Next, 5.00 g of benzenesulfonyl chloride dissolved in 5 g of dichloromethane was added dropwise at room temperature, and the flask contents were stirred for 6 hours at room temperature.

Following the reaction, the solution was filtered and the filtrate was washed several times with water. The washed filtrate was then dried over magnesium sulfate and filtered, and the solvent was removed under reduced pressure, giving a crude composition. The crude composition was purified by vacuum distillation, giving compound (1) as the target product. This compound corresponded to formula (5-1).

$^1$H-NMR (400 MHz): 0.57 ppm (t, 2H), 1.20 ppm (t, 9H), 1.59 ppm (quint, 2H), 2.97 ppm (t, 2H), 3.77 ppm (q, 6H), 4.98 ppm (t, 1H), 7.49 to 7.88 ppm (m, 5H)

Synthesis of Compound 2

A 100 mL three-necked flask was charged with 5.47 g of N-methylaminopropyltrimethoxysilane, 3.22 g of triethylamine and 15 g of dichloromethane, and the flask contents were stirred. Next, 5.00 g of benzenesulfonyl chloride dissolved in 5 g of dichloromethane was added dropwise at room temperature, and the flask contents were stirred for 6 hours at room temperature. This compound corresponded to formula (5-2).

Following the reaction, the solution was filtered and the filtrate was washed several times with water. The washed filtrate was then dried over magnesium sulfate and filtered, and the solvent was removed under reduced pressure, giving a crude composition. The crude composition was purified by vacuum distillation, giving compound (2) as the target product.

$^1$H-NMR (400 MHz): 0.65 ppm (t, 2H), 1.64 ppm (quint, 2H), 2.72 ppm (s, 3H), 3.00 ppm (t, 2H), 3.56 ppm (s, 9H), 7.50 to 7.80 ppm (m, 5H)

Synthesis of Compound 3

A 100 mL three-necked flask was charged with 5.00 g of bis[(3-trimethoxysilyl)propyl]amine, 1.67 g of triethylamine and 15 g of dichloromethane, and the flask contents were stirred. Next, 2.59 g of benzenesulfonyl chloride dissolved in 5 g of dichloromethane was added dropwise at room temperature, and the flask contents were stirred for 6 hours at room temperature.

Following the reaction, the solution was filtered and the filtrate was washed several times with water. The washed filtrate was then dried over magnesium sulfate and filtered, and the solvent was removed under reduced pressure, giving a crude composition. The crude composition was purified by vacuum distillation, giving compound (3) as the target product. This compound corresponded to formula (5-3).

$^1$H-NMR (400 MHz): 0.57 ppm (t, 4H), 1.63 ppm (quint, 4H), 3.11 ppm (t, 4H), 3.55 ppm (s, 18H), 7.47 to 7.82 ppm (m, 5H)

Synthesis of Compound 4

A 100 mL three-necked flask was charged with 5.00 g of aminopropyltriethoxysilane, 2.57 g of triethylamine and 15 g of dichloromethane, and the flask contents were stirred. Next, 2.58 g of methanesulfonyl chloride dissolved in 5 g of dichloromethane was added dropwise at room temperature, and the flask contents were stirred for 6 hours at room temperature.

Following the reaction, the solution was filtered and the filtrate was washed several times with water. The washed filtrate was then dried over magnesium sulfate and filtered, and the solvent was removed under reduced pressure, giving a crude composition. The crude composition was purified by vacuum distillation, giving compound (4) as the target product. This compound corresponded to formula (5-9).

$^1$H-NMR (400 MHz): 0.57 ppm (t, 2H), 1.20 ppm (t, 9H), 1.59 ppm (quint, 2H), 2.97 ppm (t, 2H), 3.00 ppm (s, 3H), 3.77 ppm (q, 6H), 4.98 ppm (t, 1H)

Synthesis Example 1

Compound (1) (0.044 g), 14.76 g of tetraethoxysilane, 1.98 g of phenyltrimethoxysilane and 3.61 g of methyltriethoxysilane were placed together with 30.59 g of acetone in a 100 mL flask and dissolved, following which the mixed solution was warmed under stirring with a magnetic stirrer so as to effect refluxing. An aqueous solution of 0.01 g of hydrochloric acid dissolved in 6.74 g of ion-exchanged water was then added to the mixed solution. After 240 minutes of reaction, the reaction solution was cooled to room temperature. Next, 20.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-13) and contained 0.12 mol % of sulfonamide group-bearing silane as a proportion of the total silane. The polystyrene-equivalent weight-average molecular weight (Mw) of the resulting polymer as determined by GPC was 1,500.

Synthesis Example 2

Compound (1) (0.36 g), 16.02 g of tetraethoxysilane, 1.98 g of phenyltrimethoxysilane and 3.92 g of methyltriethoxysilane were placed together with 33.43 g of acetone in a 100 mL flask and dissolved, following which the mixed solution was warmed under stirring with a magnetic stirrer so as to effect refluxing. An aqueous solution of 0.01 g of hydrochloric acid dissolved in 7.32 g of ion-exchanged water was then added to the mixed solution. After 240 minutes of reaction, the reaction solution was cooled to room temperature. Next, 22.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-13) and contained 0.91 mol % of sulfonamide group-bearing silane as a proportion of the total silane. The polystyrene-equivalent weight-average molecular weight (Mw) of the resulting polymer as determined by GPC was 1,900.

Synthesis Example 3

Compound (2) (0.040 g), 14.76 g of tetraethoxysilane, 1.98 g of phenyltrimethoxysilane and 3.61 g of methyltriethoxysilane were placed together with 30.59 g of acetone in a 100 mL flask and dissolved, following which the mixed solution was warmed under stirring with a magnetic stirrer so as to effect refluxing. An aqueous solution of 0.01 g of hydrochloric acid dissolved in 6.74 g of ion-exchanged water was then added to the mixed solution. After 240 minutes of reaction, the reaction solution was cooled to room temperature. Next, 20.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-14) and contained 0.12 mol % of sulfonamide group-bearing silane as a proportion of the total silane. The polystyrene-equivalent weight-average molecular weight (Mw) of the resulting polymer as determined by GPC was 1,800.

Synthesis Example 4

Compound (2) (0.33 g), 16.02 g of tetraethoxysilane, 1.98 g of phenyltrimethoxysilane and 3.92 g of methyltriethoxysilane were placed together with 33.38 g of acetone in a 100 mL flask and dissolved, following which the mixed solution was warmed under stirring with a magnetic stirrer so as to effect refluxing. An aqueous solution of 0.01 g of hydrochloric acid dissolved in 6.48 g of ion-exchanged water was then added to the mixed solution. After 240 minutes of reaction, the reaction solution was cooled to room temperature. Next, 22.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-14) and contained 0.91 mol % of sulfonamide group-bearing silane as a proportion of the total silane. The polystyrene-equivalent weight-average molecular weight (Mw) of the resulting polymer as determined by GPC was 1,800.

Synthesis Example 5

Compound (3) (0.059 g), 14.76 g of tetraethoxysilane, 1.98 g of phenyltrimethoxysilane and 3.61 g of methyltriethoxysilane were placed together with 30.62 g of acetone in a 100 mL flask and dissolved, following which the mixed solution was warmed under stirring with a magnetic stirrer so as to effect refluxing. An aqueous solution of 0.01 g of hydrochloric acid dissolved in 6.74 g of ion-exchanged water was then added to the mixed solution. After 240 minutes of reaction, the reaction solution was cooled to room temperature. Next, 20.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-15) and contained 0.12 mol % of sulfonamide group-bearing silane as a proportion of the total silane. The polystyrene-equivalent weight-average molecular weight (Mw) of the resulting polymer as determined by GPC was 1,800.

Synthesis Example 6

Compound (3) (0.48 g), 16.02 g of tetraethoxysilane, 1.98 g of phenyltrimethoxysilane and 3.92 g of methyltriethoxysilane were placed together with 33.61 g of acetone in a 100 mL flask and dissolved, following which the mixed solution was warmed under stirring with a magnetic stirrer so as to effect refluxing. An aqueous solution of 0.01 g of hydrochloric acid dissolved in 7.37 g of ion-exchanged water was then added to the mixed solution. After 240 minutes of reaction, the reaction solution was cooled to room temperature. Next, 22.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-15) and contained 0.91 mol % of sulfonamide group-bearing silane as a proportion of the total silane. The polystyrene-equivalent weight-average molecular weight (Mw) of the resulting polymer as determined by GPC was 2,200.

Synthesis Example 7

Compound (4) (0.036 g), 14.76 g of tetraethoxysilane, 1.98 g of phenyltrimethoxysilane and 3.61 g of methyltriethoxysilane were placed together with 30.58 g of acetone in a 100 mL flask and dissolved, following which the mixed solution was warmed under stirring with a magnetic stirrer so as to effect refluxing. An aqueous solution of 0.01 g of hydrochloric acid dissolved in 6.74 g of ion-exchanged water was then added to the mixed solution. After 240 minutes of reaction, the reaction solution was cooled to room temperature. Next, 20.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-16) and contained 0.12 mol % of sulfonamide group-bearing silane as a proportion of the total silane. The polystyrene-equivalent weight-average molecular weight (Mw) of the resulting polymer as determined by GPC was 1,800.

Synthesis Example 8

Compound (4) (0.30 g), 16.02 g of tetraethoxysilane, 1.98 g of phenyltrimethoxysilane and 3.92 g of methyltriethoxysilane were placed together with 33.33 g of acetone in a 100 mL flask and dissolved, following which the mixed solution was warmed under stirring with a magnetic stirrer so as to effect refluxing. An aqueous solution of 0.01 g of hydrochloric acid dissolved in 7.32 g of ion-exchanged water was then added to the mixed solution. After 240 minutes of reaction, the reaction solution was cooled to room temperature. Next, 22.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-16) and contained 0.91 mol % of sulfonamide group-bearing silane as a proportion of the total silane. The polystyrene-equivalent weight-average molecular weight (Mw) of the resulting polymer as determined by GPC was 2,200.

Synthesis Example 9

Compound (1) (0.018 g), 13.61 g of tetraethoxysilane, 1.98 g of phenyltrimethoxysilane and 4.48 g of methyltriethoxysilane were placed together with 30.14 g of acetone in a 100 mL flask and dissolved, following which the mixed solution was warmed under stirring with a magnetic stirrer so as to effect refluxing. An aqueous solution of 0.01 g of hydrochloric acid dissolved in 6.61 g of ion-exchanged water was then added to the mixed solution. After 240 minutes of reaction, the reaction solution was cooled to room temperature. Next, 20.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-13) and contained 0.05 mol % of sulfonamide group-bearing silane as a proportion of the total silane. The polystyrene-equivalent weight-average molecular weight (Mw) of the resulting polymer as determined by GPC was 1,600.

Synthesis Example 10

Compound (1) (0.54 g), 16.76 g of tetraethoxysilane, 1.98 g of phenyltrimethoxysilane and 4.10 g of methyltriethoxysilane were placed together with 35.07 g of acetone in a 100 mL flask and dissolved, following which the mixed solution was warmed under stirring with a magnetic stirrer so as to effect refluxing. An aqueous solution of 0.01 g of hydrochloric acid dissolved in 7.65 g of ion-exchanged water was then added to the mixed solution. After 240 minutes of reaction, the reaction solution was cooled to room temperature. Next, 22.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-13) and contained 1.30 mol % of sulfonamide group-bearing silane as a proportion of the total silane. The polystyrene-equivalent weight-average molecular weight (Mw) of the resulting polymer as determined by GPC was 1,900.

Synthesis Example 11

Compound (2) (0.017 g), 14.65 g of tetraethoxysilane, 1.98 g of phenyltrimethoxysilane and 3.58 g of methyltriethoxysilane were placed together with 30.36 g of acetone in a 100 mL flask and dissolved, following which the mixed solution was warmed under stirring with a magnetic stirrer so as to effect refluxing. An aqueous solution of 0.01 g of hydrochloric acid dissolved in 6.70 g of ion-exchanged water was then added to the mixed solution. After 240 minutes of reaction, the reaction solution was cooled to room temperature. Next, 20.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-14) and contained 0.05 mol % of sulfonamide group-bearing silane as a proportion of the total silane. The polystyrene-equivalent weight-average molecular weight (Mw) of the resulting polymer as determined by GPC was 1,700.

Synthesis Example 12

Compound (2) (0.50 g), 16.76 g of tetraethoxysilane, 1.98 g of phenyltrimethoxysilane and 4.10 g of methyltriethoxysilane were placed together with 35.01 g of acetone in a 100 mL flask and dissolved, following which the mixed solution was warmed under stirring with a magnetic stirrer so as to effect refluxing. An aqueous solution of 0.01 g of hydrochloric acid dissolved in 7.65 g of ion-exchanged water was then added to the mixed solution. After 240 minutes of reaction, the reaction solution was cooled to room temperature. Next, 22.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-14) and contained 1.30 mol % of sulfonamide group-bearing silane as a proportion of the total silane. The polystyrene-equivalent weight-average molecular weight (Mw) of the resulting polymer as determined by GPC was 1,900.

Synthesis Example 13

Compound (3) (0.024 g), 14.66 g of tetraethoxysilane, 1.98 g of phenyltrimethoxysilane and 3.58 g of methyltriethoxysilane were placed together with 30.37 g of acetone in a 100 mL flask and dissolved, following which the mixed solution was warmed under stirring with a magnetic stirrer so as to effect refluxing. An aqueous solution of 0.01 g of hydrochloric acid dissolved in 6.70 g of ion-exchanged water was then added to the mixed solution. After 240 minutes of reaction, the reaction solution was cooled to room temperature. Next, 20.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-15) and contained 0.05 mol % of sulfonamide group-bearing silane as a proportion of the total silane. The polystyrene-equivalent weight-average molecular weight (Mw) of the resulting polymer as determined by GPC was 1,700.

Synthesis Example 14

Compound (3) (0.72 g), 16.76 g of tetraethoxysilane, 1.98 g of phenyltrimethoxysilane and 4.10 g of methyltriethoxysilane were placed together with 34.34 g of acetone in a 100 mL flask and dissolved, following which the mixed solution was warmed under stirring with a magnetic stirrer so as to effect refluxing. An aqueous solution of 0.01 g of hydrochloric acid dissolved in 7.73 g of ion-exchanged water was then added to the mixed solution. After 240 minutes of reaction, the reaction solution was cooled to room temperature. Next, 22.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-15) and contained 1.30 mol % of sulfonamide group-bearing silane as a proportion of the total silane. The polystyrene-equivalent weight-average molecular weight (Mw) of the resulting polymer as determined by GPC was 2,100.

Synthesis Example 15

Compound (4) (0.015 g), 14.66 g of tetraethoxysilane, 1.98 g of phenyltrimethoxysilane and 3.58 g of methyltriethoxysilane were placed together with 30.56 g of acetone in a 100 mL flask and dissolved, following which the mixed solution was warmed under stirring with a magnetic stirrer so as to effect refluxing. An aqueous solution of 0.01 g of hydrochloric acid dissolved in 6.72 g of ion-exchanged water was then added to the mixed solution. After 240 minutes of reaction, the reaction solution was cooled to room temperature. Next, 20.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-16) and contained 0.05 mol % of sulfonamide group-bearing silane as a proportion of the total silane. The polystyrene-equivalent weight-average molecular weight (Mw) of the resulting polymer as determined by GPC was 1,900.

Synthesis Example 16

Compound (4) (0.45 g), 16.76 g of tetraethoxysilane, 1.98 g of phenyltrimethoxysilane and 4.10 g of methyltriethoxysilane were placed together with 34.94 g of acetone in a 100 mL flask and dissolved, following which the mixed solution was warmed under stirring with a magnetic stirrer so as to effect refluxing. An aqueous solution of 0.01 g of hydrochloric acid dissolved in 7.65 g of ion-exchanged water was then added to the mixed solution. After 240 minutes of reaction, the reaction solution was cooled to room temperature. Next, 22.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer was a polysiloxane derived from the starting materials which corresponded to formula (10-16) and contained 1.30 mol % of sulfonamide group-bearing silane as a proportion of the total silane. The polystyrene-equivalent weight-average molecular weight (Mw) of the resulting polymer as determined by GPC was 2,100.

Synthesis Example 17

Tetraethoxysilane (14.58 g), 1.98 g of phenyltrimethoxysilane and 3.57 g of methyltriethoxysilane were placed together with 30.20 g of acetone in a 100 mL flask and dissolved, following which the mixed solution was warmed under stirring with a magnetic stirrer so as to effect refluxing. An aqueous solution of 0.01 g of hydrochloric acid dissolved in 6.66 g of ion-exchanged water was then added to the mixed solution. After 240 minutes of reaction, the reaction solution was cooled to room temperature. Next, 20.00 g of propylene glycol monomethyl ether acetate was added to the reaction solution, then ethanol (reaction by-product), water and hydrochloric acid were removed under reduced pressure, thereby giving a hydrolytic condensation product (polymer) solution. The resulting polymer contained no sulfonamide group-bearing silane in the total silane. The polystyrene-equivalent weight-average molecular weight (Mw) of the resulting polymer as determined by GPC was 1,600.

Synthesis Example 18

Compound (1) (0.075 g), 15.19 g of tetraethoxysilane, 0.99 g of phenyltrimethoxysilane, 4.09 g of methyltriethoxysilane and 0.76 g of 4-methoxybenzyltrimethoxysilane were placed together with 31.65 g of acetone in a 100 mL flask and dissolved, following which the mixed solution was warmed under stirring with a magnetic stirrer so as to effect refluxing. Next, 6.95 g of a 0.01M aqueous hydrochloric acid solution was added to the mixed solution. After 240 minutes of reaction, the reaction solution was cooled to room temperature. Next, 21.00 g of propylene glycol monomethyl ether acetate was added to the reaction solution, then ethanol (reaction by-product), water and hydrochloric acid were removed under reduced pressure, thereby giving a hydrolytic condensation product solution. The resulting polymer was a polysiloxane derived from the starting materials which corresponded to formula (10-18) and contained 0.2 mol % of sulfonamide group-bearing silane as a proportion of the total silane. The polystyrene-equivalent weight-average molecular weight (Mw) of the resulting polymer as determined by GPC was 1,800.

Synthesis Example 19

Compound (1) (0.075 g), 15.19 g of tetraethoxysilane, 0.99 g of phenyltrimethoxysilane, 4.09 g of methyltriethoxysilane and 0.76 g of 4-ethoxyphenyltrimethoxysilane were placed together with 31.65 g of acetone in a 100 mL flask and dissolved, following which the mixed solution was warmed under stirring with a magnetic stirrer so as to effect refluxing. Next, 6.95 g of a 0.01M aqueous hydrochloric acid solution was added to the mixed solution. After 240 minutes of reaction, the reaction solution was cooled to room temperature. Next, 21.00 g of propylene glycol monomethyl ether acetate was added to the reaction solution, then ethanol (reaction by-product), water and hydrochloric acid were removed under reduced pressure, thereby giving a hydrolytic condensation product solution. The resulting polymer was a polysiloxane derived from the starting materials which corresponded to formula (10-19) and contained 0.2 mol % of sulfonamide group-bearing silane as a proportion of the total silane. The polystyrene-equivalent weight-average molecular weight (Mw) of the resulting polymer as determined by GPC was 1,800.

Synthesis Example 20

Compound (1) (0.075 g), 15.19 g of tetraethoxysilane, 0.99 g of phenyltrimethoxysilane, 4.09 g of methyltriethoxysilane and 0.81 g of 4-(methoxymethoxy)-trimethoxysilylbenzene were placed together with 31.73 g of acetone in a 100 mL flask and dissolved, following which the mixed solution was warmed under stirring with a magnetic stirrer so as to effect refluxing. Next, 6.95 g of a 0.01M aqueous hydrochloric acid solution was added to the mixed solution. After 240 minutes of reaction, the reaction solution was cooled to room temperature. Next, 21.00 g of propylene glycol monomethyl ether acetate was added to the reaction solution, then ethanol (reaction by-product), water and hydrochloric acid were removed under reduced pressure, thereby giving a hydrolytic condensation product solution. The resulting polymer was a polysiloxane derived from the starting materials which corresponded to formula (10-20) and contained 0.2 mol % of sulfonamide group-bearing silane as a proportion of the total silane. The polystyrene-equivalent weight-average molecular weight (Mw) of the resulting polymer as determined by GPC was 1,700.

Synthesis Example 21

Tetraethoxysilane (14.58 g), 0.99 g of phenyltrimethoxysilane, 3.92 g of methyltriethoxysilane and 0.73 g of 4-methoxybenzyltrimethoxysilane were placed together with 30.34 g of acetone in a 100 mL flask and dissolved, following which the mixed solution was warmed under stirring with a magnetic stirrer so as to effect refluxing. Next, 6.67 g of a 0.01M aqueous hydrochloric acid solution was added to the mixed solution. After 240 minutes of reaction, the reaction solution was cooled to room temperature. Next, 20.00 g of propylene glycol monomethyl ether acetate was added to the reaction solution, then ethanol (reaction by-product), water and hydrochloric acid were removed under reduced pressure, thereby giving a hydrolytic condensation product solution. The polystyrene-equivalent weight-average molecular weight (Mw) of the resulting polymer as determined by GPC was 1,800.

Synthesis Example 22

Tetraethoxysilane (14.58 g), 0.99 g of phenyltrimethoxysilane, 3.92 g of methyltriethoxysilane and 0.73 g of 4-ethoxyphenyltrimethoxysilane were placed together with 30.34 g of acetone in a 100 mL flask and dissolved, following which the mixed solution was warmed under stirring with a magnetic stirrer so as to effect refluxing. Next, 6.67 g of a 0.01M aqueous hydrochloric acid solution was added to the mixed solution. After 240 minutes of reaction, the reaction solution was cooled to room temperature. Next, 20.00 g of propylene glycol monomethyl ether acetate was added to the reaction solution, then ethanol (reaction by-product), water and hydrochloric acid were removed under reduced pressure, thereby giving a hydrolytic condensation product solution. The polystyrene-equivalent weight-average molecular weight (Mw) of the resulting polymer as determined by GPC was 1,800.

Synthesis Example 23

Tetraethoxysilane (14.58 g), 0.99 g of phenyltrimethoxysilane, 3.92 g of methyltriethoxysilane and 0.78 g of 4-(methoxymethoxy)-trimethoxysilylbenzene were placed together with 30.41 g of acetone in a 100 mL flask and dissolved, following which the mixed solution was warmed under stirring with a magnetic stirrer so as to effect refluxing. Next, 6.67 g of a 0.01M aqueous hydrochloric acid solution was added to the mixed solution. After 240 minutes of reaction, the reaction solution was cooled to room temperature. Next, 20.00 g of propylene glycol monomethyl ether acetate was added to the reaction solution, then ethanol (reaction by-product), water and hydrochloric acid were removed under reduced pressure, thereby giving a hydrolytic condensation product solution. The polystyrene-equivalent weight-average molecular weight (Mw) of the resulting polymer as determined by GPC was 1,800.

Example 1

A resist underlayer film material was prepared by adding 0.03 g of maleic acid, 9.81 g of ultrapure water, 0.01 g of benzyltriethylammonium chloride, 0.49 g of propylene glycol monomethyl ether acetate, 7.54 g of propylene glycol monomethyl ether and 50.54 g of propylene glycol monoethyl ether to 10.00 g of the polymer solution (29.42 mass %) obtained in Synthesis Example 1.

Example 2

A resist underlayer film material was prepared by adding 0.03 g of maleic acid, 9.59 g of ultrapure water, 0.01 g of benzyltriethylammonium chloride, 0.26 g of propylene glycol monomethyl ether acetate, 7.38 g of propylene glycol monomethyl ether and 49.44 g of propylene glycol monoethyl ether to 10.00 g of the polymer solution (28.78 mass %) obtained in Synthesis Example 2.

Example 3

A resist underlayer film material was prepared by adding 0.03 g of maleic acid, 9.86 g of ultrapure water, 0.01 g of benzyltriethylammonium chloride, 0.55 g of propylene glycol monomethyl ether acetate, 7.59 g of propylene glycol monomethyl ether and 50.80 g of propylene glycol monoethyl ether to 10.00 g of the polymer solution (29.59 mass %) obtained in Synthesis Example 3.

Example 4

A resist underlayer film material was prepared by adding 0.03 g of maleic acid, 9.64 g of ultrapure water, 0.01 g of benzyltriethylammonium chloride, 7.41 g of propylene glycol monomethyl ether acetate, 25.96 g of propylene glycol monomethyl ether and 49.67 g of propylene glycol monoethyl ether to 10.00 g of the polymer solution (28.92 mass %) obtained in Synthesis Example 4.

Example 5

A resist underlayer film material was prepared by adding 0.03 g of maleic acid, 9.51 g of ultrapure water, 0.01 g of benzyltriethylammonium chloride, 0.16 g of propylene glycol monomethyl ether acetate, 7.31 g of propylene glycol monomethyl ether and 49.00 g of propylene glycol monoethyl ether to 10.00 g of the polymer solution (28.52 mass %) obtained in Synthesis Example 5.

Example 6

A resist underlayer film material was prepared by adding 0.03 g of maleic acid, 10.11 g of ultrapure water, 0.01 g of benzyltriethylammonium chloride, 0.81 g of propylene glycol monomethyl ether acetate, 7.78 g of propylene glycol monomethyl ether and 52.10 g of propylene glycol monoethyl ether to 10.00 g of the polymer solution (30.34 mass %) obtained in Synthesis Example 6.

Example 7

A resist underlayer film material was prepared by adding 0.03 g of maleic acid, 9.89 g of ultrapure water, 0.01 g of benzyltriethylammonium chloride, 0.58 g of propylene glycol monomethyl ether acetate, 7.61 g of propylene glycol monomethyl ether and 51.01 g of propylene glycol monoethyl ether to 10.00 g of the polymer solution (29.69 mass %) obtained in Synthesis Example 7.

Example 8

A resist underlayer film material was prepared by adding 0.03 g of maleic acid, 9.58 g of ultrapure water, 0.01 g of benzyltriethylammonium chloride, 0.25 g of propylene glycol monomethyl ether acetate, 7.37 g of propylene glycol monomethyl ether and 49.38 g of propylene glycol monoethyl ether to 10.00 g of the polymer solution (28.75 mass %) obtained in Synthesis Example 8.

Example 9

A resist underlayer film material was prepared by adding 0.03 g of maleic acid, 9.81 g of ultrapure water, 0.01 g of N-(3-triethoxysilylpropyl)-4,5-dihydroimidazole, 0.49 g of propylene glycol monomethyl ether acetate, 7.54 g of propylene glycol monomethyl ether and 50.54 g of propylene glycol monoethyl ether to 10.00 g of the polymer solution (29.42 mass %) obtained in Synthesis Example 1.

Example 10

A resist underlayer film material was prepared by adding 0.03 g of maleic acid, 9.99 g of ultrapure water, 0.01 g of benzyltriethylammonium chloride, 0.69 g of propylene glycol monomethyl ether acetate, 7.69 g of propylene glycol monomethyl ether and 51.49 g of propylene glycol monoethyl ether to 10.00 g of the polymer solution (29.98 mass %) obtained in Synthesis Example 9.

Example 11

A resist underlayer film material was prepared by adding 0.03 g of maleic acid, 9.56 g of ultrapure water, 0.01 g of benzyltriethylammonium chloride, 0.22 g of propylene glycol monomethyl ether acetate, 7.35 g of propylene glycol monomethyl ether and 49.26 g of propylene glycol monoethyl ether to 10.00 g of the polymer solution (28.68 mass %) obtained in Synthesis Example 10.

Example 12

A resist underlayer film material was prepared by adding 0.03 g of maleic acid, 9.88 g of ultrapure water, 0.01 g of benzyltriethylammonium chloride, 0.56 g of propylene glycol monomethyl ether acetate, 7.60 g of propylene glycol monomethyl ether and 50.92 g of propylene glycol monoethyl ether to 10.00 g of the polymer solution (29.64 mass %) obtained in Synthesis Example 11.

Example 13

A resist underlayer film material was prepared by adding 0.03 g of maleic acid, 10.08 g of ultrapure water, 0.01 g of benzyltriethylammonium chloride, 0.77 g of propylene glycol monomethyl ether acetate, 7.75 g of propylene glycol monomethyl ether and 51.92 g of propylene glycol monoethyl ether to 10.00 g of the polymer solution (30.23 mass %) obtained in Synthesis Example 12.

Example 14

A resist underlayer film material was prepared by adding 0.03 g of maleic acid, 10.10 g of ultrapure water, 0.01 g of benzyltriethylammonium chloride, 0.79 g of propylene glycol monomethyl ether acetate, 7.77 g of propylene glycol monomethyl ether and 52.04 g of propylene glycol monoethyl ether to 10.00 g of the polymer solution (30.29 mass %) obtained in Synthesis Example 13.

Example 15

A resist underlayer film material was prepared by adding 0.03 g of maleic acid, 9.66 g of ultrapure water, 0.01 g of benzyltriethylammonium chloride, 0.33 g of propylene glycol monomethyl ether acetate, 7.43 g of propylene glycol monomethyl ether and 49.80 g of propylene glycol monoethyl ether to 10.00 g of the polymer solution (28.99 mass %) obtained in Synthesis Example 14.

Example 16

A resist underlayer film material was prepared by adding 0.03 g of maleic acid, 9.95 g of ultrapure water, 0.01 g of benzyltriethylammonium chloride, 0.63 g of propylene glycol monomethyl ether acetate, 7.65 g of propylene glycol monomethyl ether and 51.26 g of propylene glycol monoethyl ether to 10.00 g of the polymer solution (29.84 mass %) obtained in Synthesis Example 15.

Example 17

A resist underlayer film material was prepared by adding 0.03 g of maleic acid, 9.87 g of ultrapure water, 0.01 g of benzyltriethylammonium chloride, 0.56 g of propylene glycol monomethyl ether acetate, 7.60 g of propylene glycol monomethyl ether and 50.88 g of propylene glycol monoethyl ether to 10.00 g of the polymer solution (29.62 mass %) obtained in Synthesis Example 16.

Example 18

A resist underlayer film material was prepared by adding 0.03 g of maleic acid, 9.81 g of ultrapure water, 0.01 g of triphenylsulfonium maleate, 0.49 g of propylene glycol monomethyl ether acetate, 7.54 g of propylene glycol monomethyl ether and 50.54 g of propylene glycol monoethyl ether to 10.00 g of the polymer solution (29.42 mass %) obtained in Synthesis Example 1.

Example 19

A resist underlayer film material was prepared by adding 0.03 g of maleic acid, 9.81 g of ultrapure water, 0.01 g of triphenylsulfonium chloride, 0.49 g of propylene glycol monomethyl ether acetate, 7.54 g of propylene glycol monomethyl ether and 50.54 g of propylene glycol monoethyl ether to 10.00 g of the polymer solution (29.42 mass %) obtained in Synthesis Example 1.

Example 20

A resist underlayer film material was prepared by adding 0.03 g of maleic acid, 9.47 g of ultrapure water, 0.01 g 0.01 g of N-(3-triethoxysilylpropyl)-4,5-dihydroimidazole, 0.13 g of propylene glycol monomethyl ether acetate, 7.29 g of propylene glycol monomethyl ether and 48.83 g of propylene glycol monoethyl ether to 10.00 g of the polymer solution (28.42 mass %) obtained in Synthesis Example 18.

Example 21

A resist underlayer film material was prepared by adding 0.03 g of maleic acid, 9.63 g of ultrapure water, 0.01 g 0.01 g of N-(3-triethoxysilylpropyl)-4,5-dihydroimidazole, 0.30 g of propylene glycol monomethyl ether acetate, 7.41 g of propylene glycol monomethyl ether and 49.64 g of propylene glycol monoethyl ether to 10.00 g of the polymer solution (28.89 mass %) obtained in Synthesis Example 19.

Example 22

A resist underlayer film material was prepared by adding 0.03 g of maleic acid, 9.37 g of ultrapure water, 0.01 g 0.01 g of N-(3-triethoxysilylpropyl)-4,5-dihydroimidazole, 0.02 g of propylene glycol monomethyl ether acetate, 7.21 g of propylene glycol monomethyl ether and 48.28 g of propylene glycol monoethyl ether to 10.00 g of the polymer solution (28.10 mass %) obtained in Synthesis Example 20.

Comparative Example 1

A resist underlayer film material was prepared by adding 0.03 g of maleic acid, 9.71 g of ultrapure water, 0.01 g of benzyltriethylammonium chloride, 0.38 g of propylene glycol monomethyl ether acetate, 7.47 g of propylene glycol monomethyl ether and 50.02 g of propylene glycol monoethyl ether to 10.00 g of the polymer solution (29.12 mass %) obtained in Synthesis Example 17.

Comparative Example 2

A resist underlayer film material was prepared by adding 0.03 g of maleic acid, 9.56 g of ultrapure water, 0.01 g 0.01 g of N-(3-triethoxysilylpropyl)-4,5-dihydroimidazole, 0.22 g of propylene glycol monomethyl ether acetate, 7.35 g of propylene glycol monomethyl ether and 49.26 g of propylene glycol monoethyl ether to 10.00 g of the polymer solution (28.67 mass %) obtained in Synthesis Example 21.

Comparative Example 3

A resist underlayer film material was prepared by adding 0.03 g of maleic acid, 9.67 g of ultrapure water, 0.01 g 0.01 g of N-(3-triethoxysilylpropyl)-4,5-dihydroimidazole, 0.02 g of propylene glycol monomethyl ether acetate, 7.44 g of propylene glycol monomethyl ether and 49.85 g of propylene glycol monoethyl ether to 10.00 g of the polymer solution (29.01 mass %) obtained in Synthesis Example 22.

Comparative Example 4

A resist underlayer film material was prepared by adding 0.03 g of maleic acid, 9.96 g of ultrapure water, 0.01 g 0.01 g of N-(3-triethoxysilylpropyl)-4,5-dihydroimidazole, 0.65 g of propylene glycol monomethyl ether acetate, 7.66 g of propylene glycol monomethyl ether and 51.30 g of propylene glycol monoethyl ether to 10.00 g of the polymer solution (29.87 mass %) obtained in Synthesis Example 23.

Solvent Resistance Test

The resist underlayer film-forming compositions were spin-coated onto silicon wafers and baked for 1 minute on a 140° C. hot plate, thereby forming resist underlayer films. These were then immersed for 1 minute in the propylene glycol monomethyl ether acetate which is used as a solvent in the resist composition that is subsequently coated thereon. When the change in the thickness of the resist underlayer film before and after immersion was 1 nm or less, the solvent resistance was rated as "○" and so indicated in Table 1.

TABLE 1

Results of solvent resistance test

| | |
|---|---|
| Example 1 | ○ |
| Example 2 | ○ |
| Example 3 | ○ |
| Example 4 | ○ |
| Example 5 | ○ |
| Example 6 | ○ |
| Example 7 | ○ |
| Example 8 | ○ |
| Example 9 | ○ |
| Example 10 | ○ |
| Example 11 | ○ |
| Example 12 | ○ |
| Example 13 | ○ |
| Example 14 | ○ |
| Example 15 | ○ |
| Example 16 | ○ |
| Example 17 | ○ |
| Example 18 | ○ |
| Example 19 | ○ |
| Example 20 | ○ |
| Example 21 | ○ |
| Example 22 | ○ |
| Comparative Example 1 | ○ |
| Comparative Example 2 | ○ |
| Comparative Example 3 | ○ |
| Comparative Example 4 | ○ |

Optical Constants

The resist underlayer film-forming compositions were coated onto silicon wafers using a spinner, then baked at 240° C. for 1 minute on a hot plate, forming resist underlayer films (film thickness, 0.09 μm). Next, a spectroscopic ellipsometer (VUV-VASE VU-302, manufactured by J.A. Woollam Co.) was used to measure the refractive index (n value) and optical absorbance coefficient (k value, also called the attenuation coefficient) of these resist underlayer films at a wavelength of 193 nm. The results are shown in Table 2.

TABLE 2

Refractive index n and optical absorbance coefficient k

| | Refractive index n (wavelength, 193 nm) | Optical absorbance coefficient k (wavelength, 193 nm) |
|---|---|---|
| Example 1 | 1.67 | 0.19 |
| Example 2 | 1.68 | 0.19 |
| Example 3 | 1.67 | 0.19 |
| Example 4 | 1.68 | 0.19 |
| Example 5 | 1.68 | 0.19 |
| Example 6 | 1.68 | 0.19 |
| Example 7 | 1.67 | 0.19 |
| Example 8 | 1.67 | 0.18 |

TABLE 2-continued

Refractive index n and optical absorbance coefficient k

| | Refractive index n (wavelength, 193 nm) | Optical absorbance coefficient k (wavelength, 193 nm) |
|---|---|---|
| Example 9 | 1.67 | 0.19 |
| Example 10 | 1.67 | 0.19 |
| Example 11 | 1.68 | 0.19 |
| Example 12 | 1.67 | 0.19 |
| Example 13 | 1.68 | 0.19 |
| Example 14 | 1.68 | 0.19 |
| Example 15 | 1.68 | 0.19 |
| Example 16 | 1.67 | 0.19 |
| Example 17 | 1.67 | 0.18 |
| Example 18 | 1.66 | 0.21 |
| Example 19 | 1.66 | 0.21 |
| Example 20 | 1.63 | 0.16 |
| Example 21 | 1.63 | 0.16 |
| Example 22 | 1.63 | 0.16 |
| Comparative Example 1 | 1.67 | 0.19 |
| Comparative Example 2 | 1.63 | 0.16 |
| Comparative Example 3 | 1.63 | 0.16 |
| Comparative Example 4 | 1.63 | 0.16 |

Measurement of Dry Etch Rate

The following etcher and etching gas were used to measure the dry etch rate.

Etching was carried out with $CF_4$ gas using an ES401 etcher (available under this trade name from Nippon Scientific Co., Ltd.).

Etching was carried out with $O_2$ gas using an RIE-10NR etcher (available under this trade name from SAMCO Inc.).

Solutions of the resist underlayer film-forming composition prepared in Examples 1 to 22 and Comparative Examples 1 to 4 were coated onto silicon wafers using a spinner. The compositions were then baked on a hot plate at 240° C. for 1 minute, thereby forming a resist underlayer film, and the etch rates using the respective etching gases were measured. The etch rate using $CF_4$ gas as the etching gas was measured at a resist underlayer film thickness of 0.20 μm, and the etch rate using $O_2$ gas as the etching gas was measured at a resist underlayer film thickness of 0.08 μm.

In addition, using a spinner, resist films having thicknesses of 0.20 μm and 0.08 μm were formed on silicon wafers from a photoresist solution (available from Shipley under the trade name UV113). The dry etch rates were measured using $CF_4$ and $O_2$ gas as the etching gases. The dry etch rates of the resist underlayer film and the resist film were then compared. The results are shown in Table 3. The ratios in the table are the dry etch rate ratios represented as (resist underlayer film)/(resist film).

TABLE 3

Dry etch rate ratio

| | $CF_4$ gas | $O_2$ gas |
|---|---|---|
| Example 1 | 1.73 | 0.02 |
| Example 2 | 1.85 | 0.02 |
| Example 3 | 1.72 | 0.02 |
| Example 4 | 1.84 | 0.02 |
| Example 5 | 1.73 | 0.02 |
| Example 6 | 1.79 | 0.02 |
| Example 7 | 1.76 | 0.02 |
| Example 8 | 1.84 | 0.02 |
| Example 9 | 1.73 | 0.02 |
| Example 10 | 1.75 | 0.02 |
| Example 11 | 1.85 | 0.02 |
| Example 12 | 1.73 | 0.02 |
| Example 13 | 1.85 | 0.02 |

TABLE 3-continued

| | Dry etch rate ratio | |
|---|---|---|
| | $CF_4$ gas | $O_2$ gas |
| Example 14 | 1.74 | 0.02 |
| Example 15 | 1.80 | 0.02 |
| Example 16 | 1.77 | 0.02 |
| Example 17 | 1.85 | 0.02 |
| Example 18 | 1.73 | 0.02 |
| Example 19 | 1.73 | 0.02 |
| Example 20 | 1.75 | 0.02 |
| Example 21 | 1.75 | 0.02 |
| Example 22 | 1.76 | 0.02 |
| Comparative Example 1 | 1.68 | 0.02 |
| Comparative Example 2 | 1.69 | 0.02 |
| Comparative Example 3 | 1.69 | 0.02 |
| Comparative Example 4 | 1.70 | 0.02 |

Preparation of Organic Underlayer Film

A 200 mL flask was charged with 16.5 g of acenaphthylene, 1.5 g of 4-hydroxystyrene, and 60 g of 1,2-dichloroethane as a solvent. Next, 1 g of boron trifluoride was added as a polymerization initiator and the temperature was raised to 60° C., following which reaction was carried out for 24 hours. One liter of methanol and 500 g of water were added to this solution, and purification was carried out by re-precipitation. The resulting white solid was filtered, then dried, giving 11 g of a white polymer.

The resulting polymer (formula (E-1)) was subjected to $^{13}C$ and $^1H$-NMR measurement and to GPC measurement, based on which the molar ratio in the polymer was found to be acenaphthylene:4-hydroxystyrene=86:14. Mw, 6,000; Mw/Mn=1.5.

Next, 1.0 g of tetramethoxymethyl glycoluril (available from Mitsui Cytec, Ltd. under the trade name Powderlink 1174), 0.01 g of p-toluenesulfonic acid as a crosslinking catalyst, and 0.03 of Megafac R-30 (Dainippon Ink & Chemicals, Inc.) as the surfactant were added to 10 g of the resulting polymer, following which these were dissolved in 101.57 g of propylene glycol monomethyl ether acetate and 25.39 g of propylene glycol monomethyl ether. Filtration was then carried out using a polyethylene microfilter having a pore size of 0.10 μm, in addition to which filtration was carried out with a polyethylene microfilter having a pore size of 0.05 μm, thereby preparing a resist underlayer film-forming composition solution for use in a lithographic process involving a multilayer film.

Formula (E-1)

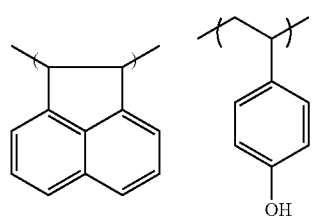

Resist Patterning Evaluation 1

An organic underlayer film (layer A)-forming composition containing the above polymer (formula (E-1)) was coated onto a silicon wafer and baked at 240° C. for 1 minute on a hot plate, thereby forming an organic underlayer film (layer A) having a thickness of 250 nm. The respective silicon-containing resist underlayer film (layer B) compositions obtained in Examples 1 to 22 and Comparative Examples 1 to 4 were formed thereon and baked at 240° C. for 1 minute on a hot plate, thereby forming a silicon-containing resist underlayer film (layer B) having a thickness of 80 nm. A commercial photoresist solution (available from Sumitomo Chemical Co., Ltd, under the trade name PAR855) was coated thereon with a spinner and baked at 100° C. for 1 minute on a hot plate, forming a photoresist film (layer C) having a thickness of 150 nm.

Patterning of the resist was carried out using an ASML PAS 5500/1100 scanner (wavelength, 193 nm; NA, σ: 0.75, 0.89/0.59 (Dipole)). The target, following development, was a so-called line-and-space (dense line) pattern having a photoresist linewidth and a space between the lines of 0.08 μM, and exposure was carried out through a mask that had been set so that the number of lines which form is 9. This was followed by a 60-second bake at 105° C. on a hot plate, cooling, then development in an aqueous solution of tetramethylammonium hydroxide (developer) having a concentration of 2.38 mass % in a 60-second, single puddle operation.

The resist pattern edge shape following lithography was rated as "Pass" when it was composed of straight lines, and was rated as "Fail" if undercuts (narrowing of the bottom), footings (widening of the bottom) or pattern collapse were present.

TABLE 4

Evaluation of resist shape

| | Resist edge shape |
|---|---|
| Example 1 | Pass |
| Example 2 | Pass |
| Example 3 | Pass |
| Example 4 | Pass |
| Example 5 | Pass |
| Example 6 | Pass |
| Example 7 | Pass |
| Example 8 | Pass |
| Example 9 | Pass |
| Example 10 | Pass (partial undercut shape) |
| Example 11 | Pass (partial footing shape) |
| Example 12 | Pass (partial undercut shape) |
| Example 13 | Pass (partial footing shape) |
| Example 14 | Pass (partial undercut shape) |
| Example 15 | Pass (partial footing shape) |
| Example 16 | Pass (partial undercut shape) |
| Example 17 | Pass (partial footing shape) |
| Example 18 | Pass |
| Example 19 | Pass |
| Example 20 | Pass |
| Example 21 | Pass |
| Example 22 | Pass |
| Comparative Example 1 | Undercut shape (partial pattern collapse) |
| Comparative Example 2 | Undercut shape (partial pattern collapse) |
| Comparative Example 3 | Undercut shape (partial pattern collapse) |
| Comparative Example 4 | Undercut shape (partial pattern collapse) |

Resist Patterning Evaluation 2

An organic underlayer film (layer A)-forming composition containing the above polymer (formula (E-1)) was coated onto a silicon wafer and baked at 240° C. for 1 minute on a hot plate, thereby forming an organic underlayer film (layer A) having a thickness of 250 nm. The respective silicon-containing resist underlayer film (layer B) compositions obtained in Examples 1 to 22 and Comparative Examples 1 to 4 were formed thereon and baked at 240° C. for 1 minute on a hot plate, thereby forming a silicon-containing resist underlayer film (layer B) having a thickness of 35 nm. A commercial photoresist solution (available from Sumitomo Chemical Co., Ltd. under the trade name PAR855) was coated thereon with a spinner and baked at 100° C. for 1 minute on a hot plate, thereby forming a photoresist film (layer C) having a thickness of 150 nm. Patterning of the resist was carried out using an ASML immersion lithography system, i.e., a TWINSCAN XT: 1900Gi scanner (wavelength, 193 nm; NA, σ: 1.20, 0.94/0.74 (C-quad); immersion liquid: water). The target, following development, was a so-called line-and-space (dense line) pattern having a photoresist linewidth and a space between the lines of 0.05 μm, and exposure was carried out through a mask that had been set so that the number of lines which form is 15.

This was followed by baking at 105° C. for 60 seconds on a hot plate, cooling, then development in an aqueous solution of tetramethylammonium hydroxide (developer) having a concentration of 2.38 mass % in a 60-second, single puddle operation.

TABLE 5

Resist Shape Evaluation

| | Resist edge shape |
|---|---|
| Example 1 | Pass |
| Example 2 | Pass |
| Example 3 | Pass |
| Example 4 | Pass |
| Example 5 | Pass |
| Example 6 | Pass |
| Example 7 | Pass |
| Example 8 | Pass |
| Example 9 | Pass |
| Example 10 | Undercut shape |
| Example 11 | Footing shape |
| Example 12 | Undercut shape |
| Example 13 | Footing shape |
| Example 14 | Undercut shape |
| Example 15 | Footing shape |
| Example 16 | Undercut shape |
| Example 17 | Footing shape |
| Example 18 | Pass |
| Example 19 | Pass |
| Example 20 | Pass |
| Example 21 | Pass |
| Example 22 | Pass |
| Comparative Example 1 | Undercut shape (partial pattern collapse) |
| Comparative Example 2 | Undercut shape (partial pattern collapse) |
| Comparative Example 3 | Undercut shape (partial pattern collapse) |
| Comparative Example 4 | Undercut shape (partial pattern collapse) |

Because the resist underlayer film obtained from the sulfonamide group-containing resist underlayer film-forming composition of the present invention contains a large amount of hetero elements, it has a sufficiently high dry etch rate with respect to the photoresist film. Because the resist underlayer films in Examples 1 to 22 have an increased etch rate by fluorine-containing gases as compared with the resist underlayer films in Comparative Examples 1 to 4, the resist pattern making up the layer overlying the resist underlayer film of the present application can be accurately transferred to the resist underlayer film of the present application.

Also, because the resist underlayer films of Examples 1 to 22 have the same resistance to etching by oxygen gas as the resist underlayer films of Comparative Examples 1 to 4, they function adequately as a hard mask during etching of the organic underlayer film and the substrate which lie below the resist underlayer film of the present invention.

Also, when 0.08 μm resist patterning was carried out, on comparing Examples 1 to 22 with Comparative Examples 1 to 4, although the refractive index n and optical absorbance coefficient k values are similar, by introducing a sulfonamide-containing monomer, a good resist pattern can be obtained.

When 0.05 μm resist patterning was carried out, good pattern shapes were obtained in Examples 1 to 9 and 18 to 22, but an undercut shape formed in Examples 10, 12, 14 and 16 in which the amount of sulfonamide-containing monomer was less than 0.1 mol %, and a footing shape formed in Examples 11, 13, 15 and 17 in which the amount of sulfonamide-containing monomer was 1.0 mol % or more. Moreover, pattern collapse occurred in Comparative Examples 1 to 4 which contained no sulfonamide groups. These results show that it is possible to control the resist shape by varying the amount of sulfonamide group-containing monomer introduced.

Evaluation of Shelf Stability

The resist underlayer film-forming compositions of Examples 1 to 22 and Comparative Examples 1 to 4 were each stored at 35° C. for 2 months, following which the coated film thicknesses were again measured and Resist Pattern Evaluation 2 was again carried out.

Cases in which there was no change in the coated film thickness following 2 months of storage at 35° C. are indicated below as "○"; when there was a change in thickness, the amount of change is indicated below,

TABLE 6

| | Change in coated film thickness after 2 months at 35° C. | Assessment of resist edge shape after 2 months at 35° C. |
|---|---|---|
| Example 1 | ○ | Pass |
| Example 2 | ○ | Pass |
| Example 3 | ○ | Pass |
| Example 4 | ○ | Pass |
| Example 5 | ○ | Pass |
| Example 6 | ○ | Pass |
| Example 7 | ○ | Pass |
| Example 8 | ○ | Pass |
| Example 9 | ○ | Pass |
| Example 10 | ○ | Undercut shape |
| Example 11 | ○ | Footing shape |
| Example 12 | ○ | Undercut shape |
| Example 13 | ○ | Footing shape |
| Example 14 | ○ | Undercut shape |
| Example 15 | ○ | Footing shape |
| Example 16 | ○ | Undercut shape |
| Example 17 | ○ | Footing shape |
| Example 18 | ○ | Pass |
| Example 19 | ○ | Pass |
| Example 20 | ○ | Pass |
| Example 21 | ○ | Pass |
| Example 22 | ○ | Pass |
| Comparative Example 1 | ○ | Undercut shape (partial pattern collapse) |
| Comparative Example 2 | ○ | Undercut shape (partial pattern collapse) |
| Comparative Example 3 | ○ | Undercut shape (partial pattern collapse) |
| Comparative Example 4 | ○ | Undercut shape (partial pattern collapse) |

The resist underlayer film-forming compositions obtained in Examples 1 to 9 and 18 to 22 showed no change in the coated film thickness even after 2 months of storage at 35° C., and also had a good resist shape.

The invention claimed is:

1. A lithographic resist underlayer film-forming composition including a silane compound having sulfonamide group, wherein
the silane compound having sulfonamide group is a hydrolyzable organosilane having a sulfonamide group in the molecule, a hydrolyzate thereof, or a hydrolytic condensation product thereof.

2. The composition according to claim 1, including a silane compound having sulfonamide group and a silane compound lacking a sulfonamide group, wherein the silane compound having sulfonamide group is present within the silane compounds overall in a proportion of less than 1 mol %.

3. The composition according to claim 1, including a silane compound having sulfonamide group and a silane compound lacking a sulfonamide group, wherein
the silane compound having sulfonamide group is present within the silane compounds overall in a proportion of from 0.1 to 0.95 mol %.

4. The composition according to claim 1, wherein the hydrolyzable organosilane is a compound of formula (1)

$$R^1_aR^2_bSi(R^3)_{4-(a+b)} \qquad \text{Formula (1)}$$

(where $R^1$ is a sulfonamide group or an organic group containing the same and is a group bonded to a silicon atom by a Si—N bond, a Si—S bond or a Si—C bond; $R^2$ is an alkyl group, an aryl group, a halogenated alkyl group, a halogenated aryl group or an alkenyl group, or an organic group having an epoxy group, an acryloyl group, a methacryloyl group, a mercapto group or a cyano group, and is a group bonded to a silicon atom by a Si—C bond; $R^3$ is an alkoxy group, an acyloxy group or a halogen atom; "a" is the integer 1 or 2; "b" is the integer 0 or 1; and "a+b" is the integer 1 or 2).

5. The composition according to claim 4, wherein the sulfonamide group corresponding to or included within $R^1$ in formula (1) is a group of formula (2)

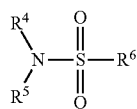

Formula (2)

(where at least one group from among $R^4$, $R^5$ and $R^6$ in formula (2) is bonded to a silicon atom directly or through a linkage group, and each remaining group is a hydrogen atom, an alkyl group, an aryl group, a halogenated alkyl group, a halogenated aryl group or an alkenyl group, or a group having an epoxy group, an acryloyl group, a methacryloyl group, a mercapto group or a cyano group).

6. The composition according to claim 1, including at least one compound selected from the group consisting of
a hydrolyzable organosilane of formula (1) and an organosilicon compound of formula (3)

$$R^7_aSi(R^8)_{4-a} \qquad \text{Formula (3)}$$

(where $R^7$ is an alkyl group, an aryl group, a halogenated alkyl group, a halogenated aryl group or an alkenyl group, or an organic group having an epoxy group, an acryloyl group, a methacryloyl group, a mercapto group or a cyano group, and is a group bonded to a silicon atom by a Si—C bond; $R^8$ is an alkoxy group, an acyloxy group or a halogen atom; and "a" is an integer from 0 to 3),
a hydrolyzable organosilane of formula (1) and an organosilicon compound of formula (4)

$$[R^9_cSi(R^{10})_{3-c}]_2Y_b \qquad \text{Formula (4)}$$

(where $R^9$ is an alkyl group and is a group bonded to a silicon atom by a Si—C bond; $R^{10}$ is an alkoxy group, an acyloxy group or a halogen atom; Y is an alkylene group or an arylene group; "b" is the integer 0 or 1; and "c" is the integer 0 or 1), and
a hydrolyzable organosilane of formula (1), an organosilicon compound of formula (3) and an organosilicon compound of formula (4),
or a hydrolyzate thereof, a hydrolytic condensation product thereof, or a mixture thereof.

7. The composition according to claim 1, including, as a polymer, a compound of formula (1) or a hydrolytic condensation product of a compound of formula (1), and a hydrolytic condensation product of a compound of formula (3).

8. The composition according to claim 1, further including an acid as a hydrolysis catalyst.

9. The composition according to claim 1, further including water.

10. A resist underlayer film obtained by coating the resist underlayer film-forming composition of claim 1 onto a semiconductor substrate, and baking the applied composition.

11. A method for fabricating semiconductor devices, comprising the steps of: coating the resist underlayer film-forming composition claim 1 onto a semiconductor substrate and baking the applied composition so as to form a resist underlayer film; coating a resist composition onto the underlayer film so as to form a resist layer; exposing the resist layer to light; developing the exposed resist so as to obtain a resist pattern; etching the resist underlayer film through the resist pattern; and processing the semiconductor substrate through the patterned resist and resist underlayer film.

12. A method for fabricating semiconductor devices, comprising the steps of: forming an organic underlayer film on a semiconductor substrate; coating thereon the resist underlayer film-forming composition of claim 1 and baking the applied composition so as to form a resist underlayer film; coating a resist composition onto the resist underlayer film so as to form a resist layer; exposing the resist layer to light; developing the exposed resist so as to obtain a resist pattern; etching the resist underlayer film through the resist pattern; etching the organic underlayer film through the patterned resist underlayer film; and processing the semiconductor substrate through the patterned organic underlayer film.

* * * * *